(12) United States Patent
Shimizu

(10) Patent No.: US 7,902,451 B2
(45) Date of Patent: Mar. 8, 2011

(54) SOLAR CELL AND FABRICATION METHOD THEREOF

(75) Inventor: Akira Shimizu, Gojo (JP)

(73) Assignee: Sharp Kabushiki Kaisha, Osaka (JP)

( * ) Notice: Subject to any disclaimer, the term of this patent is extended or adjusted under 35 U.S.C. 154(b) by 696 days.

(21) Appl. No.: 11/884,357

(22) PCT Filed: Feb. 8, 2006

(86) PCT No.: PCT/JP2006/302138
§ 371 (c)(1),
(2), (4) Date: Aug. 15, 2007

(87) PCT Pub. No.: WO2006/087951
PCT Pub. Date: Aug. 24, 2006

(65) Prior Publication Data
US 2009/0126773 A1    May 21, 2009

(30) Foreign Application Priority Data
Feb. 16, 2005    (JP) .................................. 2005-039151

(51) Int. Cl.
*H01L 31/042* (2006.01)

(52) U.S. Cl. ........................................ 136/244; 136/249

(58) Field of Classification Search .................. 136/244, 136/249
See application file for complete search history.

(56) References Cited

U.S. PATENT DOCUMENTS

| | | | |
|---|---|---|---|
| 6,207,889 B1 * | 3/2001 | Toyomura et al. | 136/244 |
| 6,543,725 B1 * | 4/2003 | Meurer et al. | 244/172.6 |
| 2002/0139411 A1 * | 10/2002 | Hiraishi et al. | 136/244 |
| 2004/0112419 A1 | 6/2004 | Boulanger | |

FOREIGN PATENT DOCUMENTS

| | | | |
|---|---|---|---|
| JP | 10-012911 | | 1/1998 |
| JP | 10012911 A | * | 1/1998 |
| JP | 10-065198 | | 3/1998 |
| JP | 10-074964 | | 3/1998 |
| JP | 11195803 A | * | 7/1999 |
| JP | 2000-012884 | | 1/2000 |
| JP | 2000-208804 | | 7/2000 |
| JP | 2001-111084 | | 4/2001 |
| JP | 2001-203380 | | 7/2001 |
| JP | 2002-083991 | | 3/2002 |
| JP | 2002-111022 | | 4/2002 |
| JP | 2002-522926 A | | 7/2002 |
| JP | 2002-305318 | | 10/2002 |
| JP | 2003-133572 | | 5/2003 |
| JP | 2003-243688 | | 8/2003 |
| JP | 2004-530293 A | | 9/2004 |
| WO | 00/10207 | | 2/2000 |
| WO | 02/074623 | | 9/2002 |

* cited by examiner

*Primary Examiner* — Jessica L Ward
*Assistant Examiner* — Jacky Yuen
(74) *Attorney, Agent, or Firm* — Nixon & Vanderhye P.C.

(57) ABSTRACT

A plurality of photoelectric conversion elements delimited by connection line regions and isolation line regions are provided on a glass substrate having an external profile of a right triangle. A connection line region is configured to connect photoelectric conversion elements in series. An isolation line region is configured to electrically isolate adjacent photoelectric conversion elements and to separate (divide) photoelectric conversion elements by a predetermined area. A connection line region is orthogonal to an isolation line region. The external profile of a photoelectric conversion elements represents a rectangle. An external interconnection to electrically connect photoelectric conversion elements is formed at an outer circumferential region of the glass substrate at the side outer to the region where photoelectric conversion elements are formed. Thus, there can be obtained an integrated type solar cell allowing connection between photoelectric conversion elements without difficulty and of efficient photoelectric conversion property.

5 Claims, 22 Drawing Sheets

US 7,902,451 B2

SOLAR CELL AND FABRICATION METHOD THEREOF

This application is the US national phase of international application PCT/JP2006/302138 filed 8 Feb. 2006, which designated the U.S. and claims priority to JP 2005-039151 filed 16 Feb. 2005, the entire content of each of which is hereby incorporated by reference.

TECHNICAL FIELD

The technology presented herein relates to a solar cell and a fabrication method thereof. Particularly, the present invention relates to a solar cell installed on the roof of a house, and a fabrication method of the solar cell.

BACKGROUND AND SUMMARY

An integrated type solar cell having a plurality of photoelectric conversion elements integrated is known as a solar cell. Conventionally, this type of integrated solar cell mainly has an external profile of substantially a rectangle such as an oblong figure or square. In contrast, the planar shape of the roof of a house includes various shapes such as a triangle and trapezoid in addition to the rectangle such as an oblong figure or square. When an integrated type solar cell is to be installed on the roof of a house, there may be a blank region on the roof where the integrated type solar cell cannot be installed depending upon the planar shape of the roof. There was a problem that the area of the roof cannot be used effectively. There was also a problem that the roof is not aesthetically acceptable.

In order to solve such problems by installing an integrated type solar cell at a region on the roof where installation of an integrated type solar cell is not allowed due to the planar shape of the roof, Patent Documents 1-7 set forth below propose an integrated type solar cell taking a triangle or trapezoid for the external profile of the integrated type solar cell.

Patent Document 1: Japanese Patent Laying-Open No. 10-12911
Patent Document 2: Japanese Patent Laying-Open No. 10-65198
Patent Document 3: Japanese Patent Laying-Open No. 2001-111084
Patent Document 4: Japanese Patent Laying-Open No. 10-74964
Patent Document 5: Japanese Patent Laying-Open No. 2001-203380
Patent Document 6: Japanese Patent Laying-Open No. 2000-208804
Patent Document 7: Japanese Patent Laying-Open No. 2003-243688

However, conventional integrated type solar cells had problems as will be set forth below. Patent Documents 1 and 7 propose an integrated solar cell having crystalline cells aligned as an integrated type solar cell. There was a problem that connection between crystalline cells is rendered complex. In Patent Document 2, connection between cells constituting an integrated type solar cell is effected by a conductive adhesive or the like applied at a predetermined end of the cell. There was a problem that the connection step thereof is rendered complicated.

Patent Document 6 had the connection between cells constituting an integrated type solar cell effected using electrical connection. Therefore, there was a problem that the connection process is rendered complex. According to Patent Document 3, connection between cells constituting an integrated type solar cell is effected via a through hole and a current collector aperture. There was a problem that associated steps are rendered tedious.

According to Patent Document 4, the vertex of each of the plurality of cells constituting an integrated type solar cell is gathered at one site. Therefore, there was a problem that the working process is rendered complex and the working precision degraded. Further, according to Patent Document 5, the difference in width (pitch) between a cell of large width and a cell of small width regarding cells constituting an integrated type solar cell is so great that it is disadvantageous from the standpoint of photoelectric conversion property as an integrated type solar cell. Further, there was a problem that the working process is rendered complex.

Thus, conventional integrated type solar cells had problems related to connection between the cells (photoelectric conversion elements) constituting the integrated type solar cell and problems related to the shape of the cells.

The example embodiment presented herein is directed to solving such problems seen in conventional integrated type solar cells. One aspect is to provide an integrated type solar cell that allows connection between photoelectric conversion elements without difficulty and capable of efficient photoelectric conversion. Another aspect is to provide a fabrication method of such a solar cell.

A solar cell according to the present embodiment corresponds to a solar cell including a plurality of photoelectric conversion elements. The solar cell includes a transparent insulation substrate, a prescribed layer, and a plurality of photoelectric conversion elements. The transparent insulation substrate has a predetermined external profile. The prescribed layer is formed on a main surface of the transparent insulation substrate, constituting photoelectric conversion elements. The plurality of photoelectric conversion elements are formed by delimiting the prescribed layer with a plurality of isolation line regions spaced apart from each other, extending in one direction and exposing the surface of the transparent insulation substrate, and a plurality of connection line regions spaced apart from each other, extending in another direction crossing the one direction. At each of a plurality of regions located between the isolation line regions, a string of photoelectric conversion elements electrically connected in series by connection line regions is formed. By the string formed in each of the regions located between the plurality of isolation line regions, an integrated string having one string electrically connected with a further string is formed in plurality. The plurality of integrated strings are electrically connected in parallel.

According to the configuration set forth above, electrical connection of a plurality of photoelectric conversion elements can be effected readily on a transparent insulation substrate by the connection line regions and isolation line regions formed at the transparent insulation substrate, without the usage of an additional member. By delimiting each photoelectric conversion element through an isolation line region formed extending in one direction and a connection line region extending in another direction crossing the one direction, the shape as well as the area of each photoelectric conversion element will become identical. Therefore, variation in the photoelectric conversion property is eliminated, allowing output efficiently.

In order to dispose such a solar cell in accordance with the planar shape of the roof, the outer circumference of the transparent insulation substrate is preferably constituted of at least three outer edges, respectively extending linear, i.e. a first outer edge, and second and third outer edges not parallel to the first outer edge.

In order to eliminate potential difference between the plurality of integrated strings, it is preferable to set the sum of the number of photoelectric conversion elements in one string and the number of photoelectric conversion elements in a further string identical with each other.

In the case where the external profile of the transparent insulation substrate is a triangle formed of a first outer edge, a second outer edge, and a third outer edge, preferably each of the isolation line regions is arranged substantially parallel to the first outer edge, and each of the connection line regions is arranged substantially parallel to the second outer edge. In this case, the external profile of the photoelectric conversion element is a rectangle or a parallelogram.

In order to eliminate any region that does not contribute to power generation at the third outer edge side in the case where the transparent insulation substrate has a triangular external profile, preferably an additional photoelectric conversion element electrically connected to a photoelectric conversion element by respective corresponding connection line regions and of a trapezoidal shape with an area identical to the area of the photoelectric conversion element is formed at each region located between the isolation line regions at the third outer edge side of the transparent insulation substrate.

Furthermore, in order to better accommodate various planar shapes of the roof, there is provided an additional transparent insulation substrate having an external profile of a quadrilateral, and a plurality of additional photoelectric conversion elements formed at the additional transparent insulation substrate. By electrically connecting the plurality of photoelectric conversion elements formed at the transparent insulation substrate and the additional photoelectric conversion elements formed at the additional transparent insulation substrate and arranging the transparent insulation substrate and the additional transparent insulation substrate in parallel, an external profile corresponding to a trapezoid may be obtained.

For each of the photoelectric conversion element to take a triangular external profile in the case where the external profile of the transparent insulation substrate is a triangle, there may be provided a plurality of additional connection line regions spaced apart from each other, and substantially parallel to the third outer edge.

In order to prevent any unintentional short-circuiting between a connection line and another connection line, the isolation line region is preferably formed having a width eliminating the region where a connection line region crosses an additional connection line region and to expose the surface of the transparent insulation substrate, or formed as a pair of regions to expose the surface of the transparent insulation substrate. A region where a connection line region crosses an additional connection line region is located between one and the other of the regions of a pair.

The one string and the further string are preferably electrically connected on the transparent insulation substrate by the patterning of the isolation line regions. Accordingly, connection between strings can be effected readily and reliably without an additional interconnection.

Respective terminals for electrically connecting one string with a further string are preferably connected to each other at the same outer edge side of the transparent insulation substrate by arranging the one string and the further string such that the direction of current flowing through one string is opposite to the direction of current flowing through the further string at each of the plurality of integrated strings. Accordingly, it is not necessary to route the interconnection. Furthermore, crossing between interconnections is eliminated. As used herein, a triangle, a quadrilateral, and a trapezoid are not intended to refer to the strict mathematical geometry, but instead a figure which can be recognized at a glance.

A fabrication method of a solar cell according to the present embodiment includes the steps of: forming a first conductive layer on a main surface of a transparent insulation substrate; forming a photoelectric conversion layer on the first conductive layer; forming a second conductive layer on the photoelectric conversion layer; forming predetermined connection line regions spaced apart from each other and extending in one direction by scribing each of the first conductive layer, photoelectric conversion layer and second conductive layer; and forming isolation line regions spaced apart from each other, extending in another direction crossing the one direction, and exposing the surface of the transparent insulation substrate at the second conductive layer, photoelectric conversion layer, and first conductive layer. In the step of forming connection line regions, the connection line regions are formed to provide a plurality of photoelectric conversion elements including a first conductive layer, photoelectric conversion layer, and second conductive layer, and to constitute a string having adjacent photoelectric conversion elements connected to each other in series, at the region to be located between the isolation line regions. In the step of forming isolation line regions, the isolation line regions form an integrated string electrically connecting one string with a further string in plurality, by the string formed at each of the regions to be located between the isolation line regions, and the plurality of integrated strings are electrically connected in parallel.

By the method set forth above, electrical connection of a plurality of photoelectric conversion elements can be effected readily on a transparent insulation substrate by connection line regions and isolation line regions formed at the transparent insulation substrate. Furthermore, by the delimitation of each photoelectric conversion element through the isolation line regions and connection line regions, each photoelectric conversion element will have the same profile and the same area. Thus, variation in the photoelectric conversion property is eliminated to allow output efficiently.

DESCRIPTION OF THE REFERENCE SIGNS 1 integrated type solar cell, 2 glass substrate, 4 transparent conductive film, 6 photoelectric conversion layer, 8 back electrode, 10 first scribe line region, 12 second scribe line region, 14 third scribe line region, 16 connection line region, 18 isolation line region, 20 photoelectric conversion element, 21 integrated string, 21a-21h string, 22 plus electrode, 24 minus electrode, 25a-25d external interconnection, 26 non-power-generation region, 28 trapezoidal power generation region.

DESCRIPTION

First Embodiment

An integrated type solar cell according to an embodiment of the present invention has a layer of photoelectric conversion element sequentially formed on a glass substrate having a predetermined external profile. This layer is delimited by connection line regions and isolation line regions formed concurrently with the aforementioned step. A plurality of photoelectric conversion elements delimited as set forth above are arranged on the glass substrate. In association with the plurality of photoelectric conversion elements, photoelectric conversion elements are connected in series with each other by the connection line regions. Further, the photoelectric conversion elements are electrically isolated by the isolation line regions, and an external interconnection is formed.

(1) External Profile of Integrated Type Solar Cell (Pattern of Photoelectric Conversion Elements)

Figure 1:
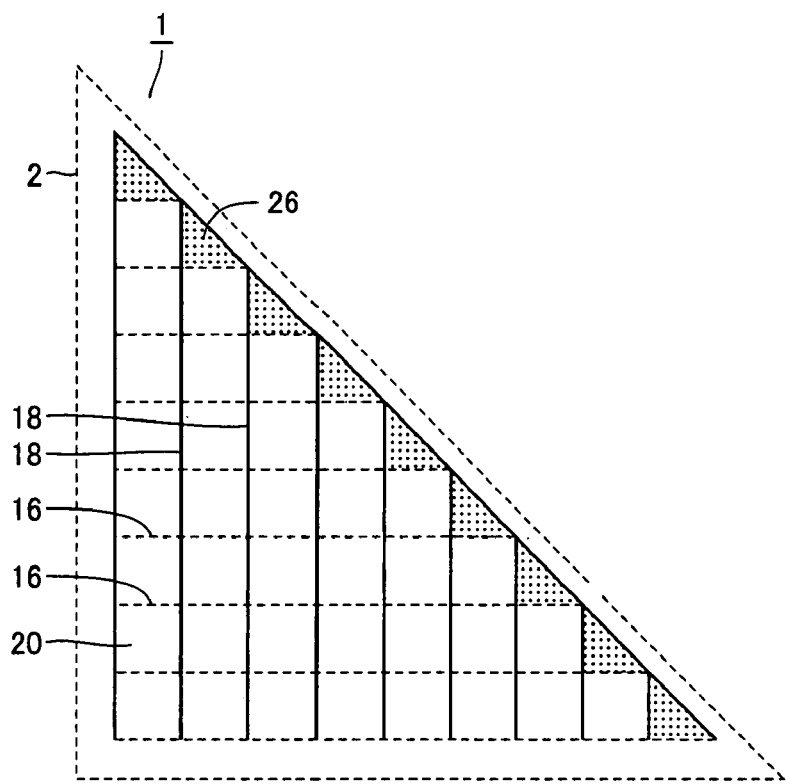
FIG. 1 is a plan view of a first example of a pattern of photoelectric conversion elements corresponding to the external profile of an integrated type solar cell according to a first embodiment.

The external profile of the integrated type solar cell is determined by the external profile of the glass substrate. The pattern of the photoelectric conversion elements substantially reflects the external profile of the glass substrate. For such an integrated type solar cell, photoelectric conversion elements formed on a glass substrate having an external profile of a right triangle will be described specifically as an example. As shown in FIG. 1, a plurality of photoelectric conversion elements 20 delimited by connection line regions 16 and isolation line regions 18 are arranged on a glass substrate 2 having an external profile of a right triangle. Connection line region 16 serves to connect photoelectric conversion elements 20 in series, and is formed by a combination of a predetermined scribing process and film-growing process when the layer of photoelectric conversion element 20 is formed. Isolation line region 18 serves to electrically isolate an adjacent photoelectric conversion element 20 and to separate (divide) photoelectric conversion element 20 by a predetermined area.

Connection line regions 16 are formed spaced apart from each other so as to be parallel to an outer edge corresponding to one of the line segments constituting the right angle of the right triangle glass substrate. Isolation line regions 18 are formed spaced apart from each other so as to be parallel to the outer edge corresponding to the other of the line segments constituting the right angle. Accordingly, connection line regions 16 are orthogonal to isolation line regions 18, offering a rectangular external profile for photoelectric conversion element 20 delimited by connection line region 16 and isolation line region 18. At the outer edge corresponding to the hypotenuse of the right triangle, a triangular nonpower-generation region 26 not contributing to power generation is present. As will be described afterwards, an external interconnection to electrically connect photoelectric conversion elements is provided at the circumferential region of glass substrate 2 at the outer side of the region where photoelectric conversion elements 20 are formed.

Although all isolation line regions 18 are spaced apart by a constant interval in integrated type solar cell 1 of FIG. 1, an isolation line region 18 does not have to be provided at the region where the operating voltages of adjacent photoelectric conversion elements 20 with an isolation line region 18 therebetween are identical. Further, a simple type isolation line region with incomplete isolation may be formed. In the case where the operating voltages of adjacent photoelectric conversion elements 20 with an isolation line region 18 therebetween differs, an isolation line region having the withstand voltage corresponding to the potential difference must be formed. Specific formation of isolation line region 18 and connection line region 16 will be described afterwards.

Photoelectric conversion element 20 is not particularly limited in type and structure, and may be a single junction type photoelectric conversion employing, for example, amorphous silicon, microcrystal silicon, crystal thin film silicon, compound semiconductor thin film, organic thin film semiconductor and the like, or a multijunction type photoelectric conversion element formed of layers thereof.

Variation in the external profile of an integrated type solar cell (pattern of photoelectric conversion elements) will be described hereinafter. Respective drawings in the description set forth above indicate the pattern of photoelectric conversion elements, and the glass substrate is not illustrated.

Figure 2:
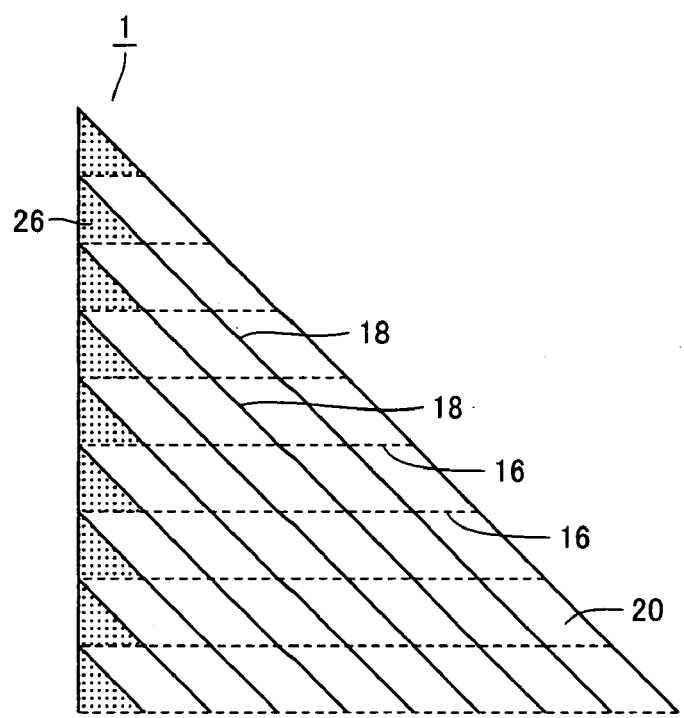
FIG. 2 is a plan view of a second example of a pattern of photoelectric conversion elements corresponding to the external profile of an integrated type solar cell of the first embodiment.

In integrated type solar cell 1 of glass substrate 2 having an external profile of a right triangle as set forth above, connection line regions 16 may be formed to be parallel to the outer edge corresponding to one of the line segments constituting the right angle of the right triangle glass substrate, and isolation line regions 18 may be formed to be parallel to the outer edge corresponding to the hypotenuse, as shown in FIG. 2, for example, besides the configuration set forth above. In this case, the external profile of photoelectric conversion elements 20 delimited by connection line regions 16 and isolation line regions 18 offers a parallelogram.

Figure 3:
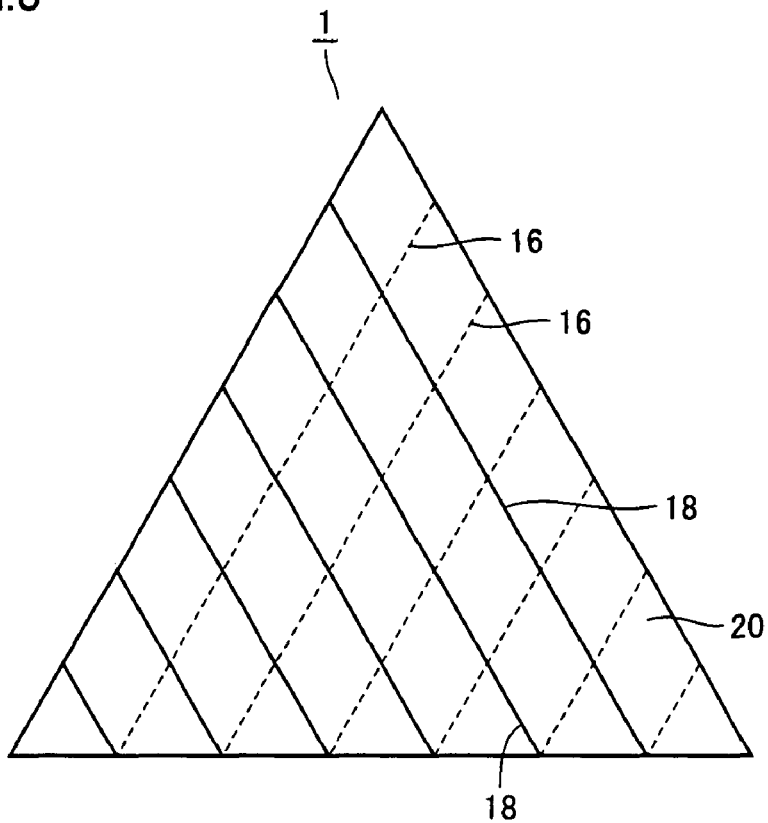
FIG. 3 is a plan view of a third example of a pattern of photoelectric conversion elements corresponding to the external profile of an integrated type solar cell of the first embodiment.

The external profile of an integrated type solar cell (pattern of photoelectric conversion elements) corresponding to a triangle is not particularly limited to a right triangle. For example, an equilateral triangle as shown in FIG. 3 is allowed. In this case, connection line regions 16 are formed to be parallel to the outer edge corresponding to one of the line segments constituting the equilateral triangle glass substrate, and isolation line regions 18 are formed to be parallel to the outer edge corresponding to another of the line segments. The external profile of photoelectric conversion element 20 delimited by connection line regions 16 and isolation line regions 18 offers a rhomboid or a parallelogram.

Although the type of the triangle is not particularly limited for the integrated type solar cell (pattern of photoelectric conversion elements) having an external profile of a triangle, a right triangle or an equilateral triangle set forth above is more preferable from the standpoint of practical usage and easiness in processing based on the actual planar shape of the roof.

In integrated type solar cell 1 shown in FIG. 1, there remains a nonpower-generation region 26 not contributing to power generation at the outer edge side corresponding to the hypotenuse of the right triangle. In integrated type solar cell 1 shown in FIG. 2, there remains a nonpower-generation region 26 not contributing to power generation at the outer edge side corresponding to one of the line segments constituting the right angle of the right triangle. An integrated type solar cell having such nonpower-generation region 26 replaced with a photoelectric conversion element of a predetermined shape will be described hereinafter.

Figure 4:
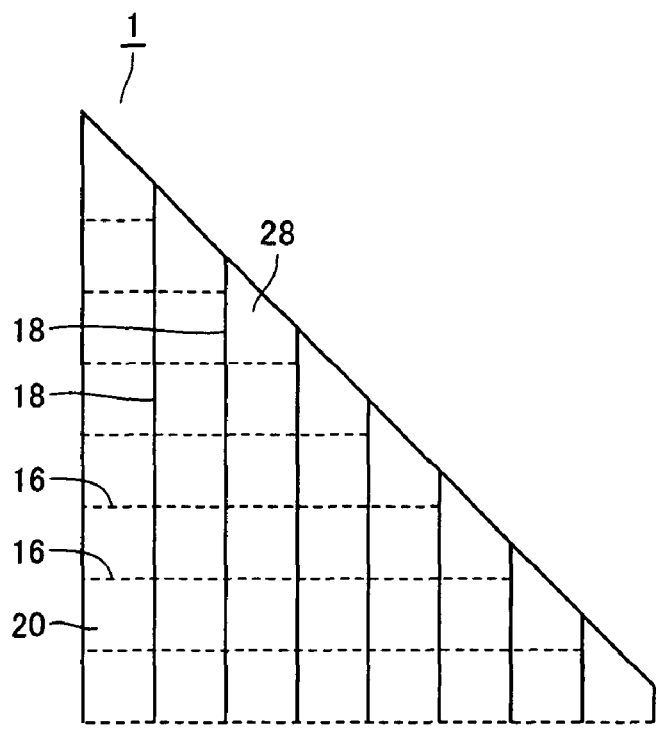
FIG. 4 is a plan view of a fourth example of a pattern of photoelectric conversion elements corresponding to the external profile of an integrated type solar cell of the first embodiment.

With respect to integrated type solar cell having triangular nonpower-generation region 26 remaining at the outer edge side corresponding to the hypotenuse of the triangle shown in FIG. 1, a trapezoidal photoelectric conversion element 28 replaces nonpower-generation region 26, as shown in FIG. 4. The area of trapezoidal photoelectric conversion element 28 is made identical to the area of other rectangular photoelectric conversion elements 20. The glass substrate of integrated type solar cell 1 with such photoelectric conversion elements 20 and 28 formed may take an external profile of a trapezoid or a triangle.

Figure 5:
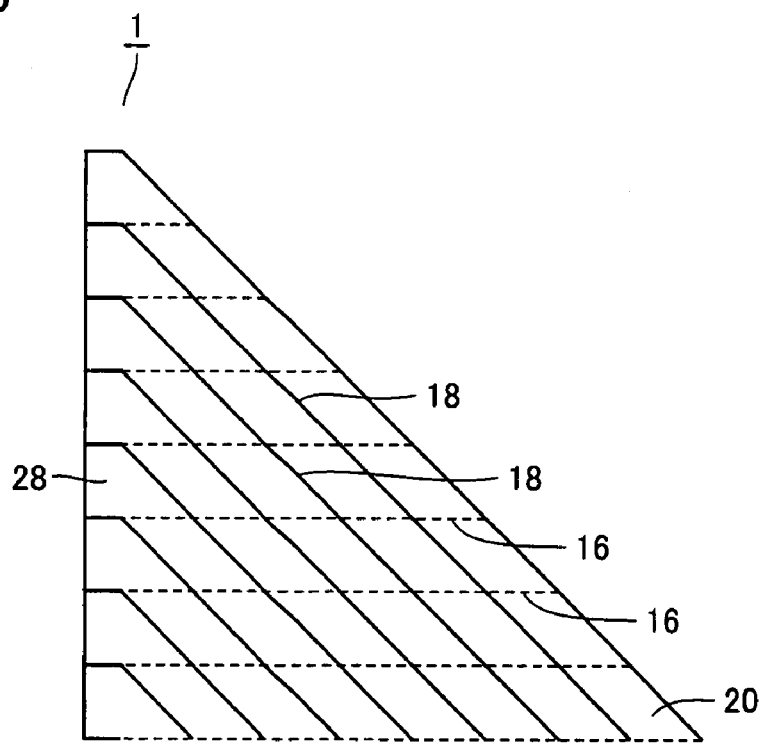
FIG. 5 is a plan view of a fifth example of a pattern of photoelectric conversion elements corresponding to the external profile of an integrated type solar cell of the first embodiment.
Figure 6:
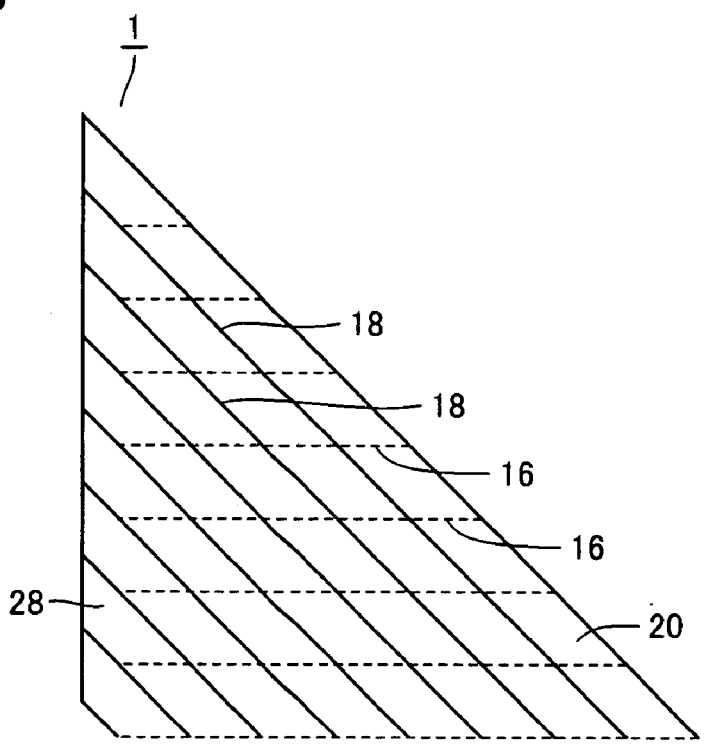
FIG. 6 is a plan view of a sixth example of a pattern of photoelectric conversion elements corresponding to the external profile of an integrated type solar cell of the first embodiment.

With respect to integrated type solar cell 1 having triangular nonpower-generation region 26 remaining at the outer edge side corresponding to one of the line segments constituting the right angle of the triangle shown in FIG. 2, trapezoid photoelectric conversion element 28 is formed replacing nonpower-generation region 26, as shown in FIG. 5 or 6. The area of this trapezoidal photoelectric conversion element 28 is made identical to the area of a photoelectric conversion element 20 having the shape of a rhomboid or a parallelogram. The glass substrate of integrated type solar cell 1 with such photoelectric conversion elements 20 and 28 formed may have an external profile of a trapezoid or triangle.

Integrated type solar cell 1 set forth above can increase the amount of power generation by eliminating nonpower-generation region 26, i.e. through replacement of nonpower-generation region 26 with photoelectric conversion element 28.

Figure 7:
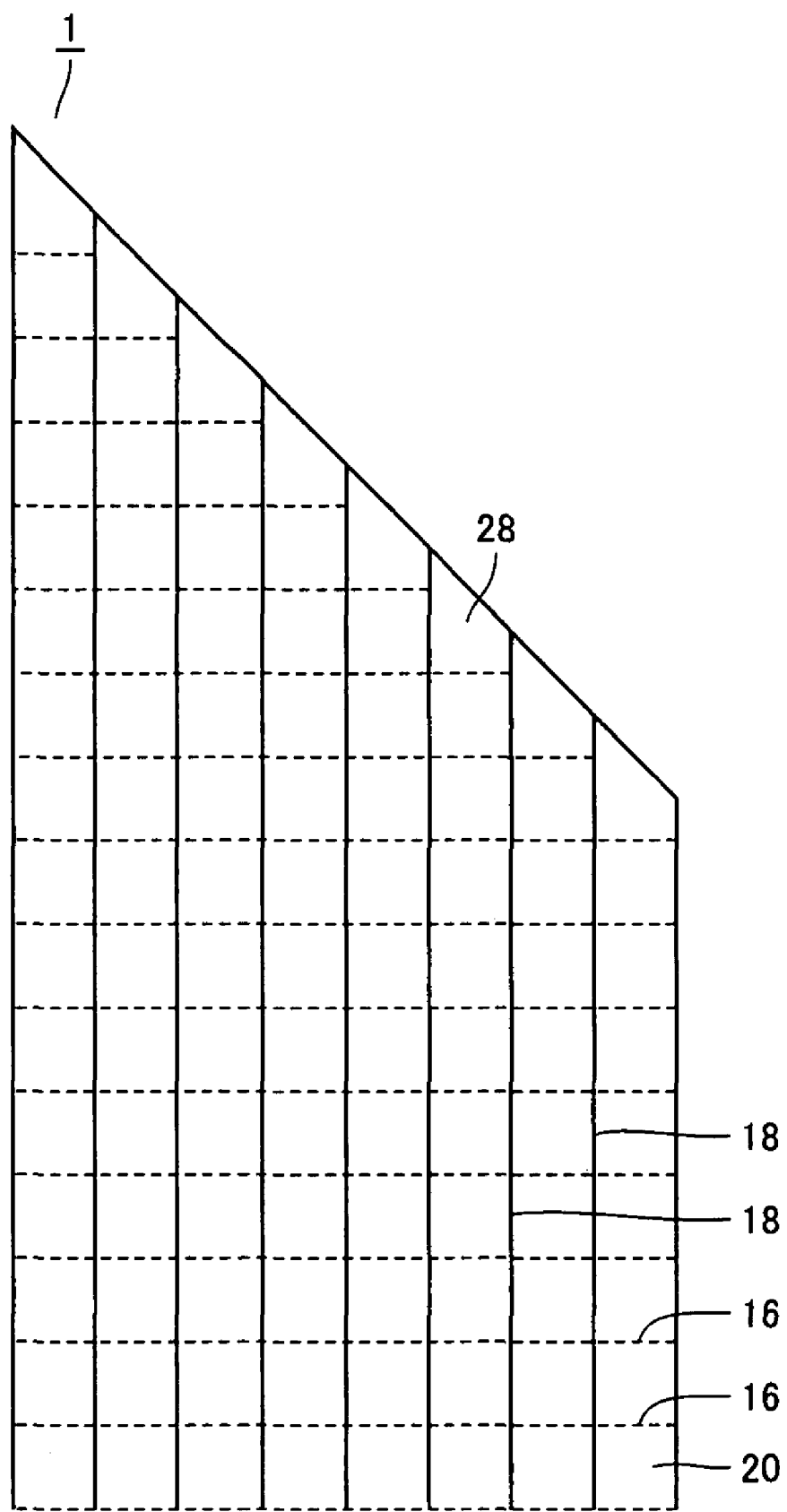
FIG. 7 is a plan view of a seventh example of a pattern of photoelectric conversion elements corresponding to the external profile of an integrated type solar cell of the first embodiment.

A trapezoidal integrated type solar cell (a pattern of photoelectric conversion elements) corresponding to a development of an integrated type solar cell having a triangular or trapezoidal external profile will be described hereinafter. Integrated type solar cell 1 shown in FIG. 7 takes an external profile of a trapezoid with two line segments constituting a right angle by extending the outer edge side corresponding to one of the line segments constituting the right angle in integrated type solar cell 1 of FIG. 4. In other words, an integrated type solar cell having an integrated type solar cell of a rectangular external profile combined with integrated type solar cell 1 of FIG. 4 is implemented. Rectangular photoelectric conversion elements 20 and trapezoidal photoelectric conversion elements 28 constitute this integrated type solar cell 1.

Figure 8:
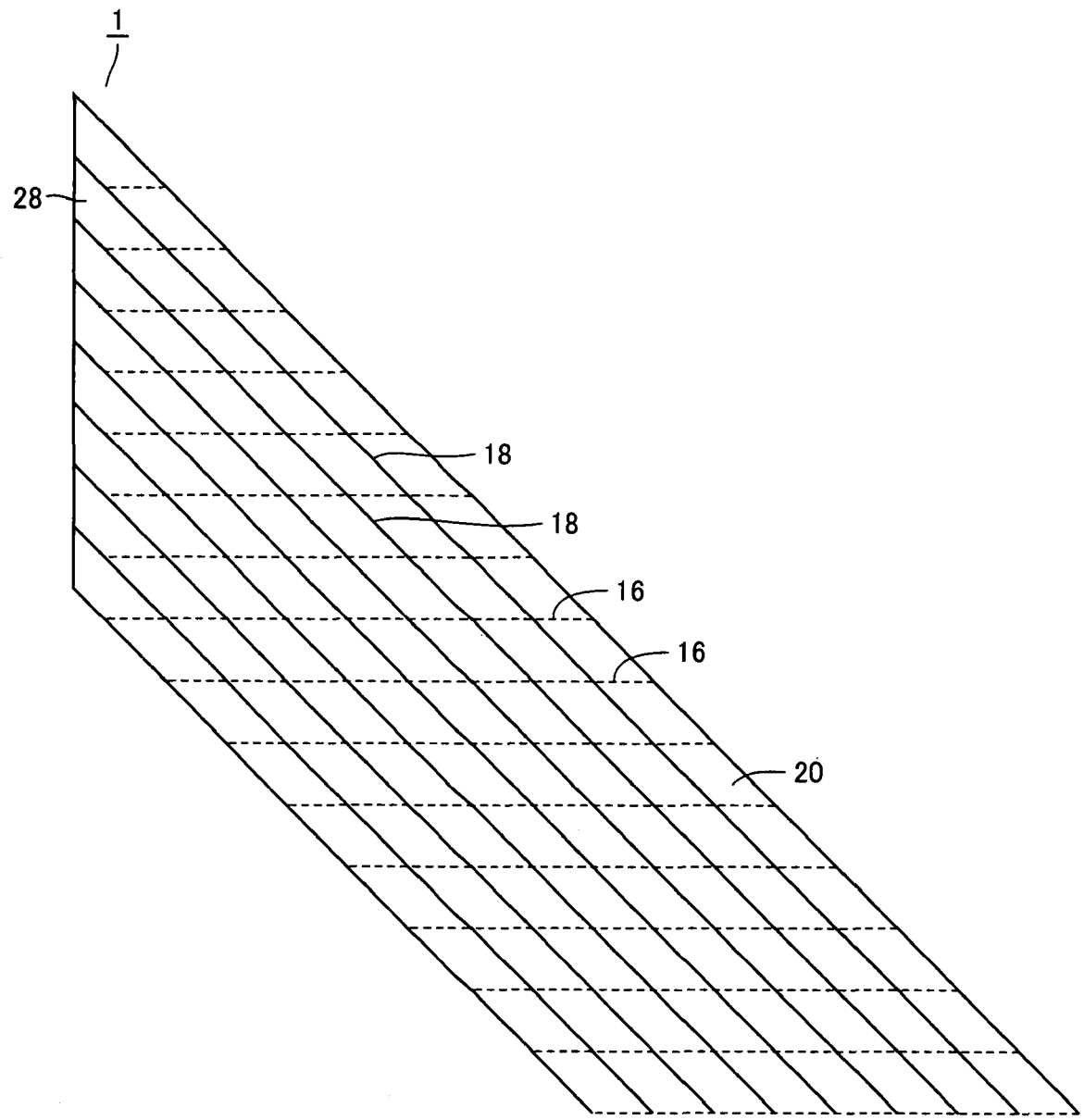
FIG. 8 is a plan view of an eighth example of a pattern of photoelectric conversion elements corresponding to the external profile of an integrated type solar cell of the first embodiment.

Integrated type solar cell 1 of FIG. 8 takes an external profile of a trapezoid without a right angle by extending the side of the outer edge corresponding to one line segment of integrated type solar cell 1 of FIG. 6. Integrated type solar cell 1 of FIG. 8 corresponds to integrated type solar cell 1 having a parallelogram external profile combined with integrated type solar cell 1 of FIG. 6. Photoelectric conversion elements 20 having the shape of a parallelogram and photoelectric conversion elements 28 having the shape of a trapezoid constitute this integrated type solar cell 1. Thus, an integrated type solar cell corresponding to the planar shape of the roof can be provided.

Figure 9:
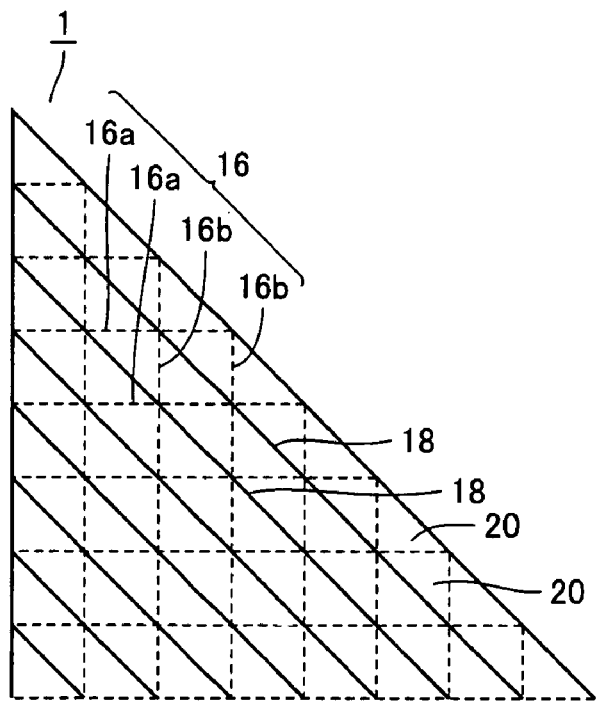
FIG. 9 is a plan view of a ninth example of a pattern of photoelectric conversion elements corresponding to the external profile of an integrated type solar cell of the first embodiment.

With respect to integrated type solar cell 1 of FIG. 2, an integrated type solar cell further including a connection line region formed parallel to the outer edge corresponding to the other of the two line segments constituting the right angle will be described hereinafter. Referring to FIG. 9, integrated type solar cell 1 with an external profile of a right triangle has additional connection line regions 16*b* spaced apart, parallel to the outer edge corresponding to the other of the two line segments constituting the right angle in the right triangle. Additional connection line regions 16*b* are formed to cross connection line regions 16*a* and isolation line regions 18 at the region where connection line region 16*a* and isolation line region 18 cross each other.

Connection line regions 16*a* and 16*b* are provided to electrically connect adjacent photoelectric conversion elements 20 together in series. Specifically, a first scribe region patterned at a transparent conductive film formed on the glass substrate, a second scribe region patterned at a photoelectric conversion layer including a pn junction layer formed on the transparent conductive film, and a third scribe region patterned at a back electrode layer formed on the photoelectric conversion layer constitute the connection line regions.

Figure 10:
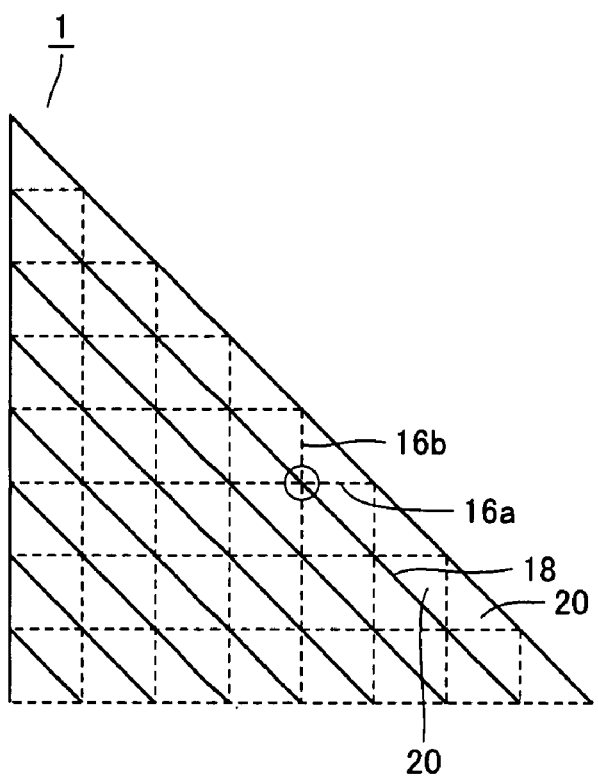
FIG. 10 is a first plan view of the region where an isolation line region and connection line region cross in the integrated type solar cell of FIG. 9 according to the first embodiment.
Figure 11:
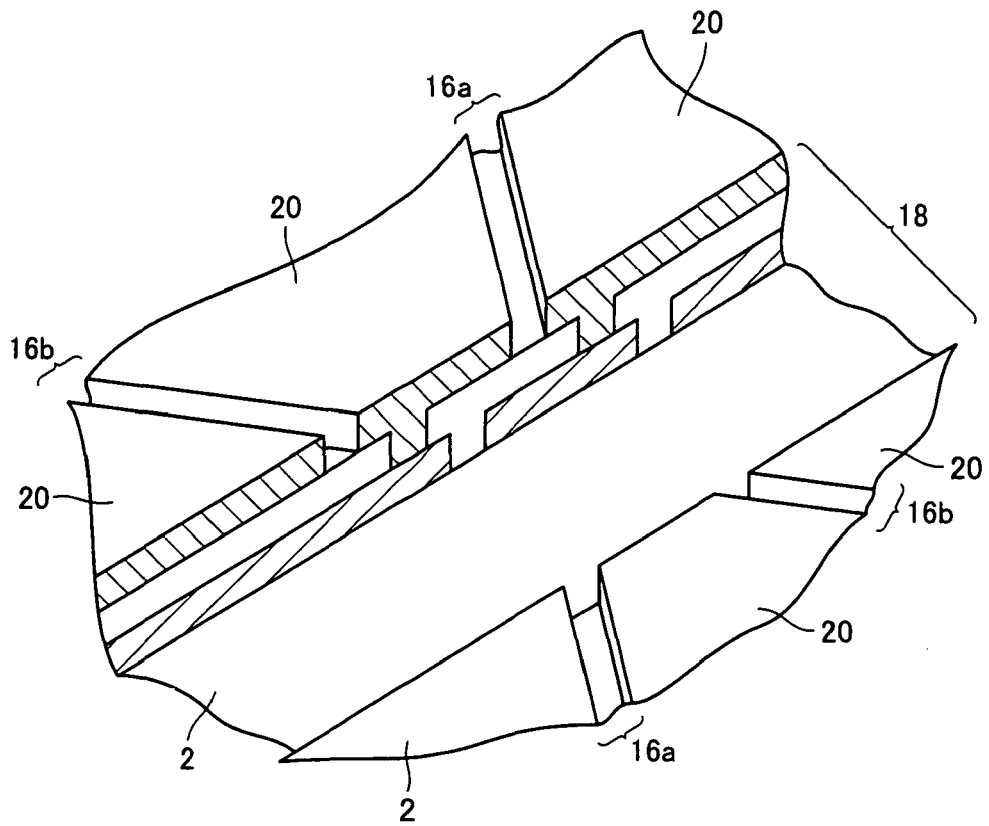
FIG. 11 is a partial enlarged perspective view of the region in the circle of FIG. 10 according to the first embodiment.

The crossing of different connection line regions 16*a* and 16*b* will cause electric short-circuiting between photoelectric conversion elements 20 that normally should not be electrically connected due to the crossing between one of first scribe regions and the other of first scribe regions and/or between one of second scribe regions and the other of second scribe regions, as will be described afterwards. Therefore, insulation must be ensured so that such undesirable short-circuiting will not occur. An example of a configuration in view of such isolation is shown in FIGS. 10 and 11. Specifically, at the region where connection line region 16*a* crosses connection line 16*b* in the integrated type solar cell shown in FIG. 10, for example, there is provided an isolation line region of a relatively large width, as isolation line region 18, that can eliminate the entirety of the region where the connection line regions cross, as shown in FIG. 11.

Figure 12:
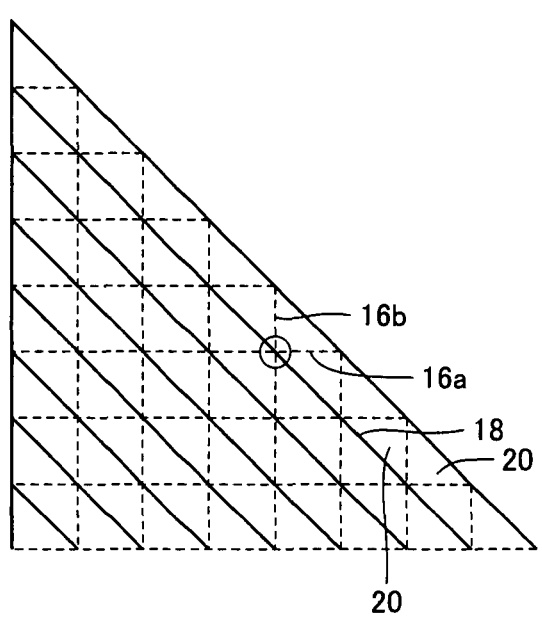
FIG. 12 is a second plan view of a region where an isolation line region and connection line region cross in the integrated type solar cell of FIG. 9 according to the first embodiment.
Figure 13:
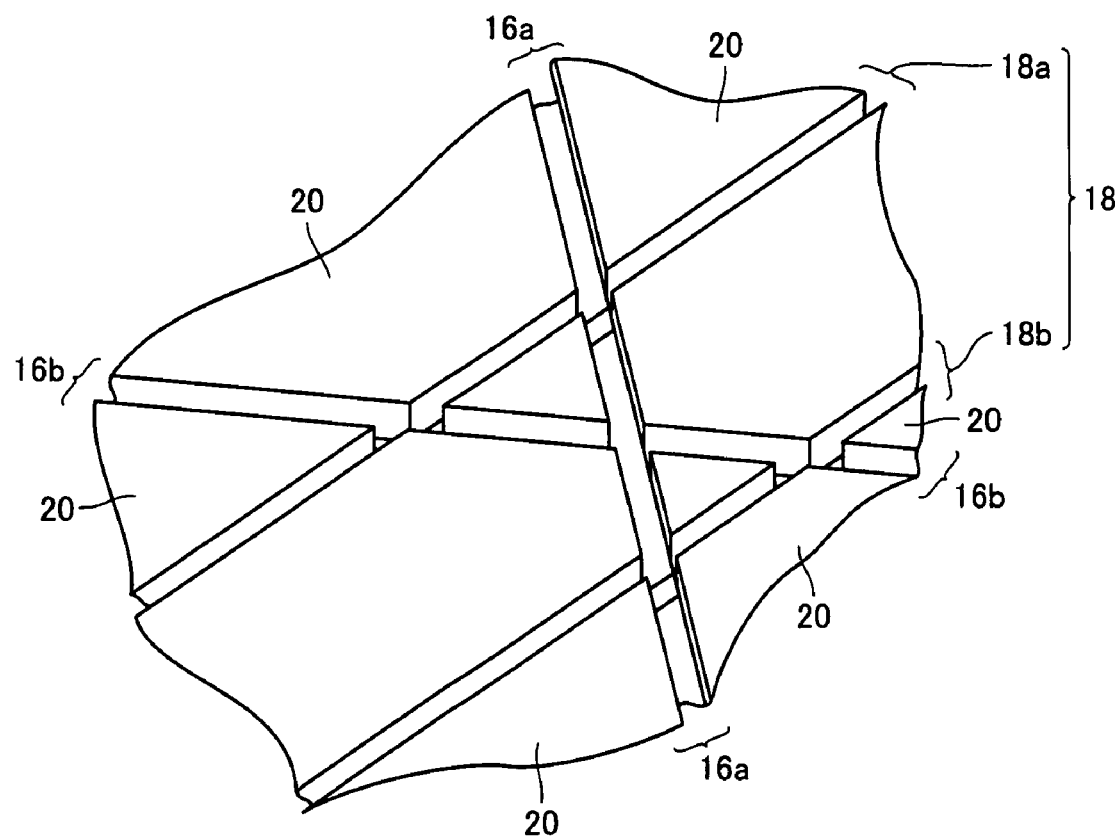
FIG. 13 is a partial enlarged perspective view of the region in the circle of FIG. 12 according to the first embodiment.

In addition to forming such an isolation line region having a large width, another example is shown in FIGS. 12 and 13. At the region where connection line 16*a* crosses connection line 16*b* in the integrated type solar cell shown in FIG. 12, for example, there is provided a pair of isolation line regions 18*a* and 18*b*, as isolation line region 18. The region where connection line 16*a* crosses connection line 16*b* is located between one and the other of the isolation line regions constituting a pair. In the case where such isolation line regions 18*a* and 18*b* constituting a pair are to be formed, the working precision can be ensured by providing a certain level of the distance between isolation line region 18*a* and isolation line region 18*b*.

(2) String and Integrated String

A string and integrated string of the integrated type solar cell will be described hereinafter. As used herein, a string refers to a series of photoelectric conversion elements electrically connected in series by a connection line region. An integrated string refers to such a string further electrically connected to another string in series.

Figure 14:
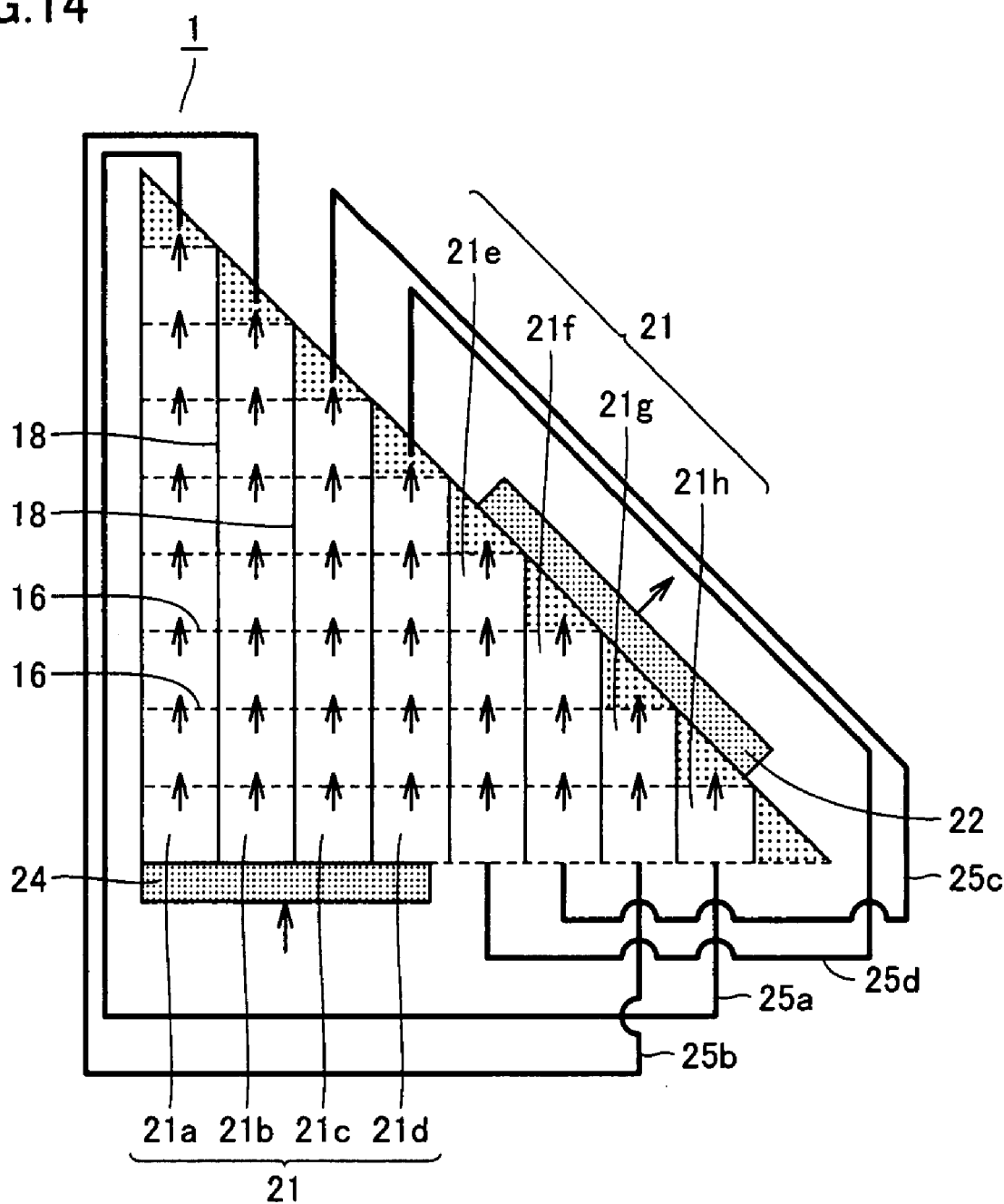
FIG. 14 is a plan view of a first example of the string arrangement and current direction of an integrated string by photoelectric conversion elements corresponding to the external profile of the integrated type solar cell according to the first embodiment.

The arrangement pattern of the integrated string includes various versions. An example of such an integrated pattern will be described based on the integrated type solar cell having an external profile of a right triangle shown in FIG. 1. In integrated type solar cell 1 shown in FIG. 14, one integrated string is formed by electrically connecting two strings in series. In this case, four integrated strings 21 are provided, including a first integrated string having string 2*a* and string 21*h* connected in series by an external interconnection 25*a*, a second integrated string having string 21*b* and string 21*g* connected in series by an external interconnection 25*b*, a third integrated string having string 21*c* and string 21*f* connected in series by an external interconnection 25*c*, and a fourth integrated string having string 2*d* and string 2*e* connected in series by an external interconnection 25*d*. As will be described afterwards, external interconnections 25*a*-25*d* are formed at the same time on a glass substrate by patterning when photoelectric conversion elements are formed.

Each of strings 21*a*-21*h* has photoelectric conversion elements 20 arranged such that the direction (arrow) of current flow is identical. Furthermore, each of the four integrated strings 21 is connected such that the sum of the number of photoelectric conversion elements 20 included in the two strings is identical between all the four integrated strings. In this case, i.e. the sum is nine. The four integrated strings 21 are electrically connected in parallel. A plus electrode 22 is formed at the outer edge side corresponding to the hypotenuse of the right triangle in strings 21*e*-21*h*. A minus electrode 24 is formed at the outer edge side corresponding to one of the two line segments constituting the right angle of the right triangle in strings 2*a*-2*d*.

Figure 15:
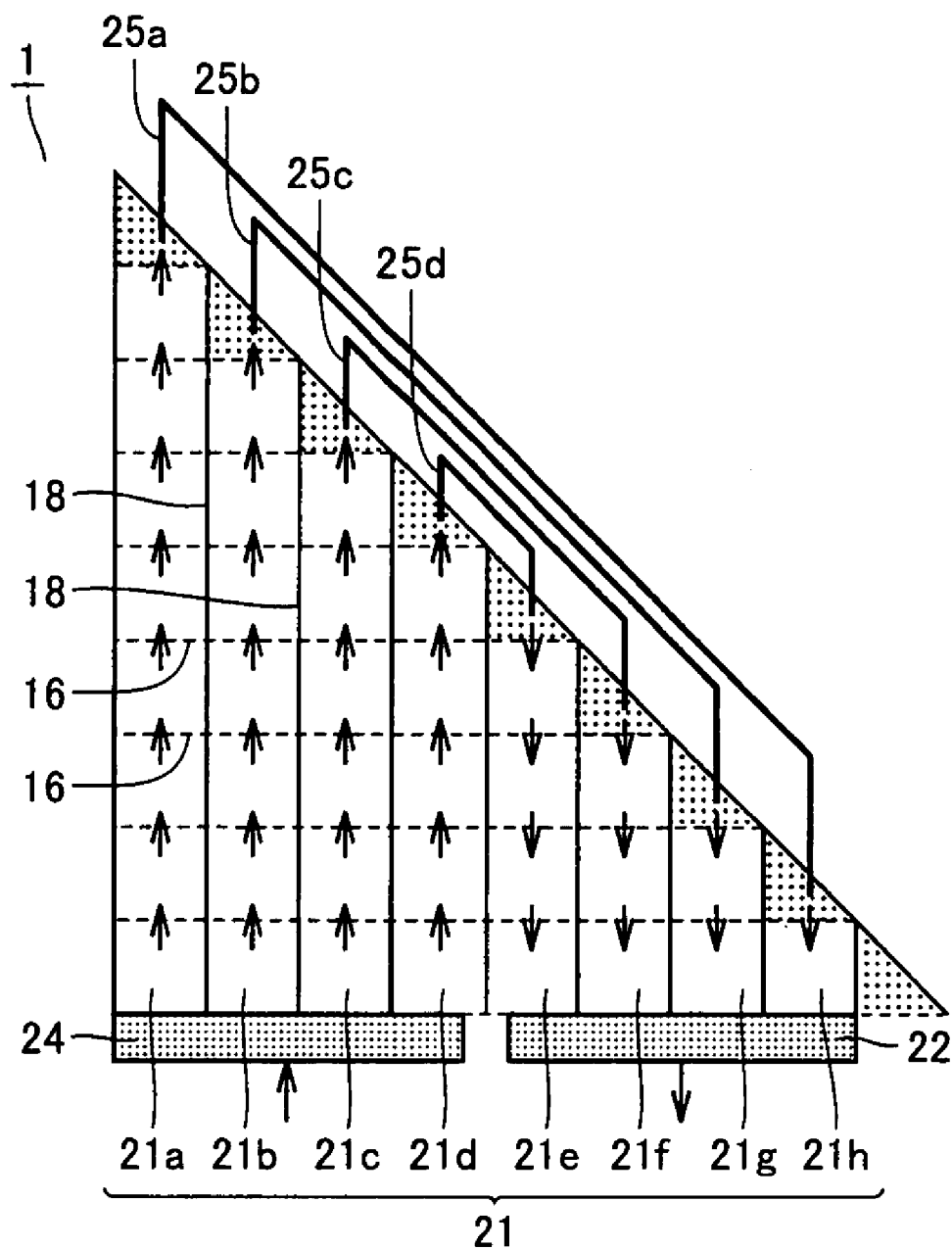
FIG. 15 is a plan view of a second example of the string arrangement and current direction of an integrated string by photoelectric conversion elements corresponding to the external profile of the integrated type solar cell according to the first embodiment.

Another example of the integrated pattern based on the integrated type solar cell of FIG. 1 is shown in FIG. 15. Integrated type solar cell 1 of FIG. 15 includes four integrated strings 21, i.e., a first integrated string having string 21*a* and string 21*h* connected in series by external interconnection 25*a*, a second integrated string having string 21*b* and string 21*g* connected in series by external interconnection 25*b*, a third integrated string having string 21*c* and string 21*f* connected in series by external interconnection 25*c*, and a fourth integrated string having string 21*d* and string 21*e* connected in series by external interconnection 25*d*.

Each of the four integrated strings 21 has photoelectric conversion elements 20 arranged such that the direction (arrow) of current flowing through one string is opposite to the direction (arrow) of current flowing through the other string between the two strings connected in series. External interconnection 25*a* of the first integrated string, external interconnection 25*b* of the second integrated string, external interconnection 25*c* of the third integrated string, and external interconnection 25*d* of the fourth integrated string are all provided at the outer edge side corresponding to the hypotenuse of the right triangle. Plus electrode 22 is formed at the outer edge side corresponding to one of the two line segments constituting the right angle of the right triangle in strings 21e-21h. Minus electrode 24 is formed at the outer edge side corresponding to that one line segment in strings 2a-2d.

By arranging photoelectric conversion elements 20 such that the direction of current flowing through one string and the direction of current flowing through the other of the two strings connected in series are opposite to each other, external interconnections 25a-25d electrically connecting one of strings 21a-21d with the other of strings 21e-21h can all be provided at the outer edge side corresponding to the hypotenuse of the right triangle. Crossing between external interconnections 25a-25d is eliminated. Further, the pattern of external interconnections 25a-25d can be rendered more simple.

An example of an integrated pattern corresponding to the integrated type solar cell of FIG. 2 will be described hereinafter. Integrated type solar cell 1 of FIG. 16 includes four integrated strings 21, i.e., a first integrated string having string 21a and string 21h connected in series by external interconnection 25a, a second integrated string having string 21b and string 21g connected in series by external interconnection 25b, a third integrated string having string 2c and string 2f connected in series by external interconnection 25c, and a fourth integrated string having string 21d and string 21e connected in series by external interconnection 25d.

Each of the four integrated strings 21 has photoelectric conversion elements 20 formed such that the direction (arrow) of current flowing through one string is opposite to the direction (arrow) of current flowing through the other string between the two strings connected in series. External interconnection 25a of the first integrated string, external interconnection 25b of the second integrated string, external interconnection 25c of the third integrated string, and external interconnection 25d of the fourth integrated string are all provided at the outer edge side corresponding to one of the two line segments constituting the right angle of the right triangle. Plus electrode 22 is formed at the outer edge side corresponding to the other of the two line segments constituting the right angle of the right triangle in strings 21e-21h. Minus electrode 24 is formed at the outer edge side corresponding to that other line segment in strings 21a-21d.

Figure 17:
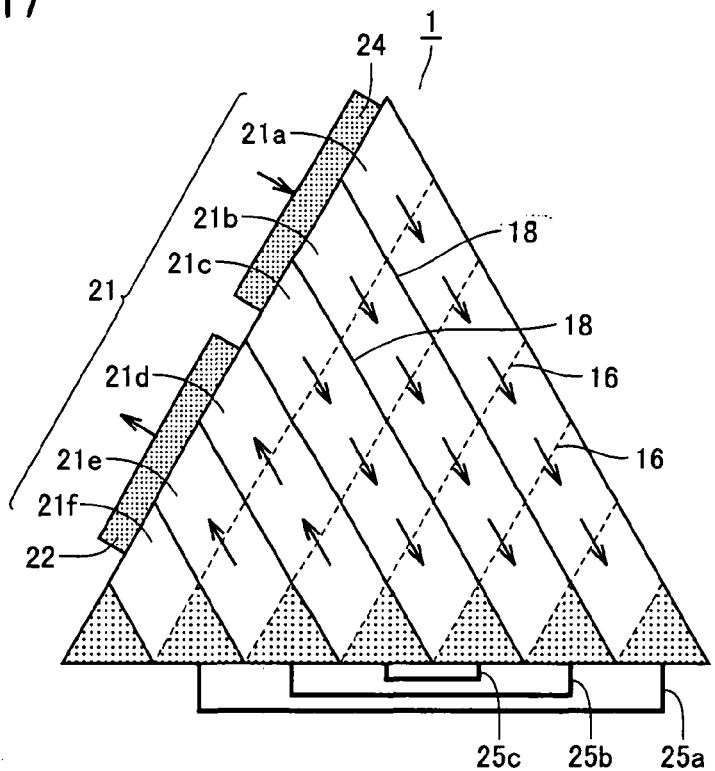
FIG. 17 is a plan view of a fourth example of the string arrangement and current direction of an integrated string by photoelectric conversion elements corresponding to the external profile of the integrated type solar cell according to the first embodiment.

Another example of the integrated pattern based on the integrated type solar cell of FIG. 3 is shown in FIG. 17. Integrated type solar cell 1 of FIG. 17 includes three integrated strings 21, i.e., a first integrated string having string 21a and string 21f connected in series by external interconnection 25a, a second integrated string having string 21b and string 21e connected in series by external interconnection 25b, and a third integrated string having string 2c and string 2d connected in series by external interconnection 25c.

Each of the three integrated strings 21 has photoelectric conversion elements 20 formed such that the direction (arrow) of current flowing through one string is opposite to the direction (arrow) of current flowing through the other string between the two strings connected in series. External interconnection 25a of the first integrated string, external interconnection 25b of the second integrated string, and external interconnection 25c of the third integrated string are all provided at the outer edge side corresponding to one line segment of the equilateral triangle. Plus electrode 22 is formed at the outer edge side corresponding to another of the line segments constituting the equilateral triangle in strings 21d-21f. Minus electrode 24 is formed at the outer edge side corresponding to that another one line segment in strings 21a-21c.

Figure 18:
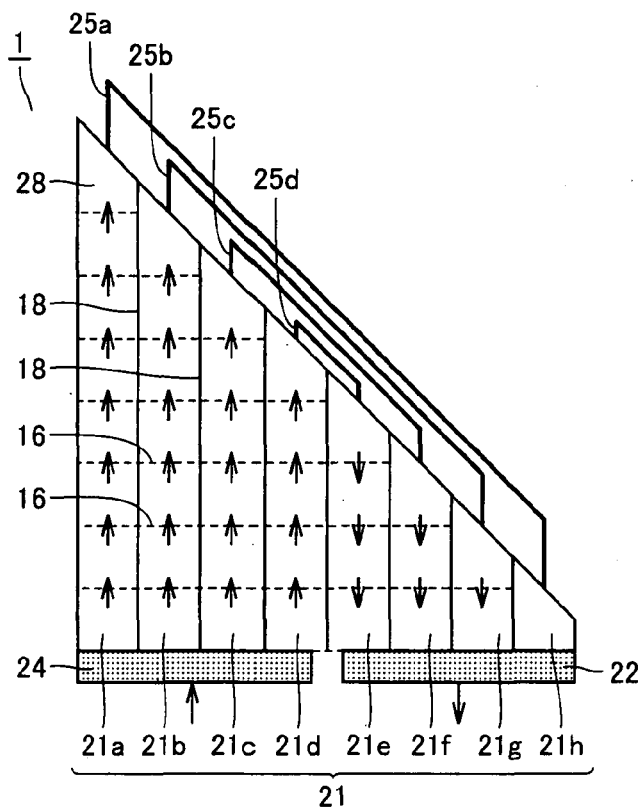
FIG. 18 is a plan view of a fifth example of the string arrangement and current direction of an integrated string by photoelectric conversion elements corresponding to the external profile of the integrated type solar cell according to the first embodiment.

An example of an integrated pattern corresponding to the integrated type solar cell of FIG. 4 will be described hereinafter. Integrated type solar cell 1 of FIG. 18 includes four integrated strings 21, i.e., a first integrated string having string 21a and string 21h connected in series by external interconnection 25a, a second integrated string having string 2b and string 21g connected in series by external interconnection 25b, a third integrated string having string 2c and string 2f connected in series by external interconnection 25c, and a fourth integrated string having string 21d and string 21e connected in series by external interconnection 25d.

Each of the four integrated strings 21 has photoelectric conversion elements 20 formed such that the direction (arrow) of current flowing through one string is opposite to the direction (arrow) of current flowing through the other string among the two strings connected in series. External interconnection 25a of the first integrated string, external interconnection 25b of the second integrated string, external interconnection 25c of the third integrated string, and external interconnection 25d of the fourth integrated string are all provided at the outer edge side corresponding to the oblique line segment of a trapezoid or a schematic right triangle. Plus electrode 22 is formed at the outer edge side corresponding to one of the two line segments constituting the right angle of the trapezoid or schematic right triangle in strings 21e-21h. Minus electrode 24 is formed at the outer edge side corresponding to that one line segment in strings 21a-21d.

Figure 19:
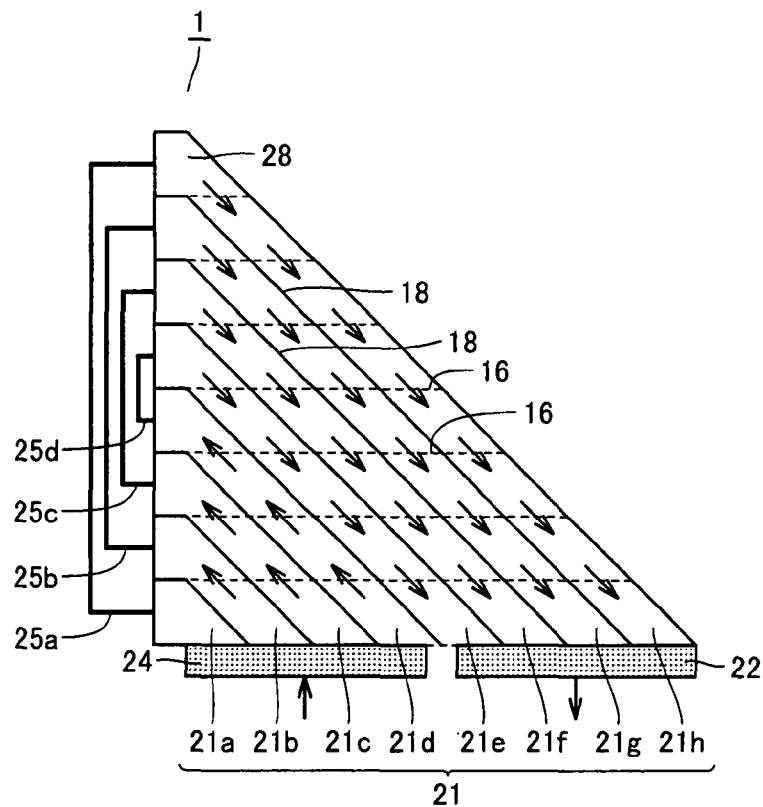
FIG. 19 is a plan view of a sixth example of the string arrangement and current direction of an integrated string by photoelectric conversion elements corresponding to the external profile of the integrated type solar cell according to the first embodiment.

An example of an integrated pattern corresponding to the integrated type solar cell of FIG. 5 will be described hereinafter. Integrated type solar cell 1 of FIG. 19 includes four integrated strings 21, i.e., a first integrated string having string 2a and string 21h connected in series by external interconnection 25a, a second integrated string having string 21b and string 21g connected in series by external interconnection 25b, a third integrated string having string 2c and string 2f connected in series by external interconnection 25c, and a fourth integrated string having string 21d and string 21e connected in series by external interconnection 25d.

Each of the four integrated strings 21 has photoelectric conversion elements 20 formed such that the direction (arrow) of current flowing through one string is opposite to the direction (arrow) of current flowing through the other string among the two strings connected in series. External interconnection 25a of the first integrated string, external interconnection 25b of the second integrated string, external interconnection 25c of the third integrated string, and external interconnection 25d of the fourth integrated string are all provided at the outer edge side corresponding to one of the two line segments constituting the right angle of the trapezoid or schematic right triangle. Plus electrode 22 is formed at the outer edge side corresponding to the other of the two line segments constituting the right angle of the trapezoid or schematic right triangle in strings 21e-21h. Minus electrode 24 is formed at the outer edge side corresponding to that other line segment in strings 2a-2d.

Figure 20:
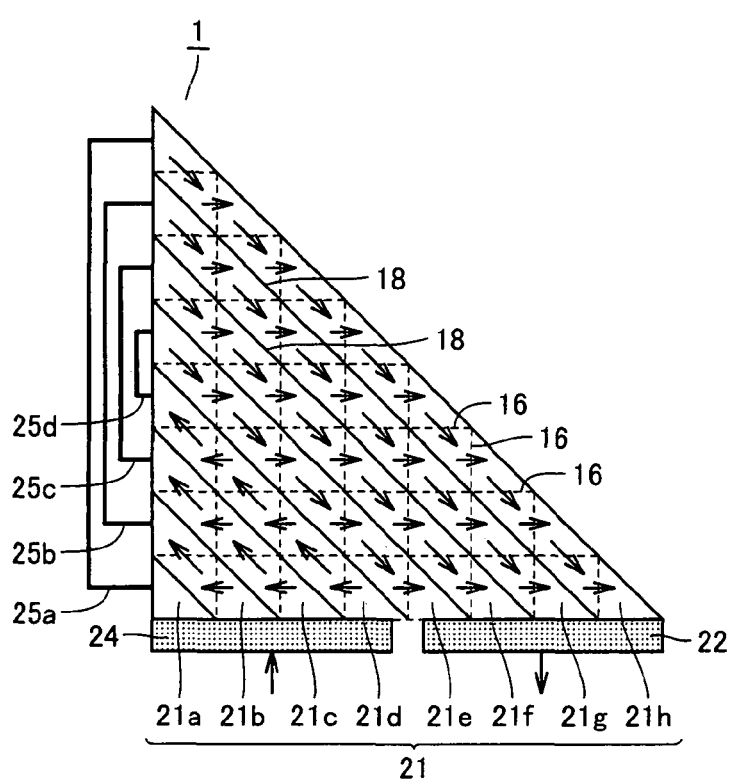
FIG. 20 is a plan view of a seventh example of the string arrangement and current direction of an integrated string by photoelectric conversion elements corresponding to the external profile of the integrated type solar cell according to the first embodiment.

An example of an integrated pattern corresponding to the integrated type solar cell of FIG. 9 will be described hereinafter. Integrated type solar cell 1 of FIG. 20 includes four integrated strings 21, i.e., a first integrated string having string 21a and string 21h connected in series by external interconnection 25a, a second integrated string having string 21b and string 21g connected in series by external interconnection 25b, a third integrated string having string 2c and string 2f connected in series by external interconnection 25c, and a fourth integrated string having string 21d and string 21e connected in series by external interconnection 25d.

Each of the four integrated strings 21 has photoelectric conversion elements 20 formed such that the direction (arrow) of current flowing through one string is opposite to the direction (arrow) of current flowing through the other string among the two strings connected in series. External interconnection 25a of the first integrated string, external interconnection 25b of the second integrated string, external interconnection 25c of the third integrated string, and external interconnection 25d of the fourth integrated string are all provided at the outer edge side corresponding to one of the two line segments constituting the right angle of the right triangle. Plus electrode 22 is formed at the outer edge side corresponding to the other of the two line segments constituting the right angle of the right triangle in strings 21e-21h. Minus electrode 24 is formed at the outer edge side corresponding to that other line segment in strings 21a-21d.

Thus, integrated type solar cells 1 shown in FIGS. 15-20 have photoelectric conversion elements 20 arranged such that the direction (arrow) of current flowing through one string and the direction (arrow) of current flowing through the other of two strings connected in series are opposite to each other in each of the plurality of integrated strings 21. Accordingly, the external interconnection electrically connecting one string with the other string can be provided at the outer edge side corresponding to one line segment of the glass substrate with an external profile. Crossing between external interconnections can be eliminated. Further, the pattern of the external interconnection can be simplified.

Figure 21:
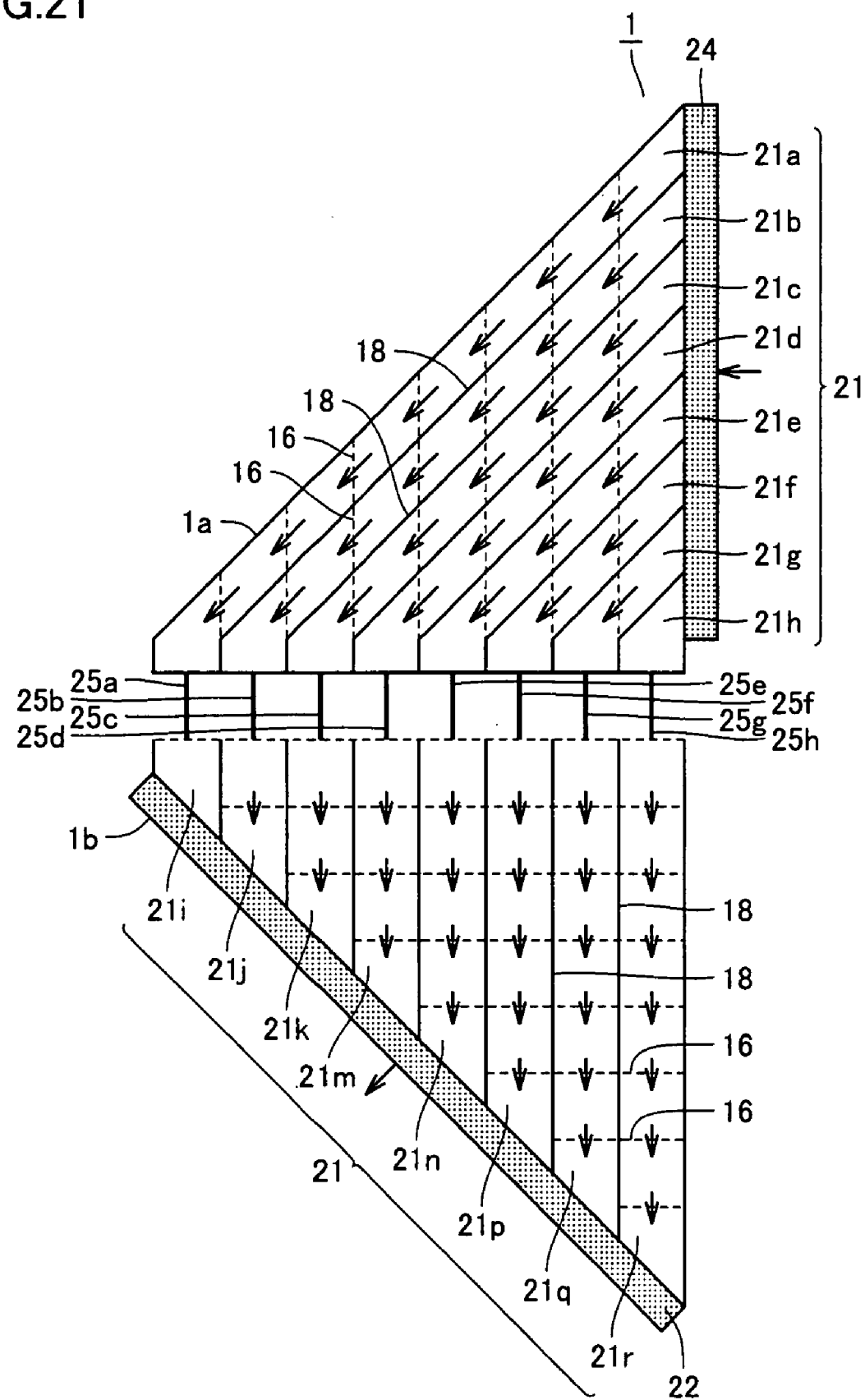
FIG. 21 is a plan view of an eighth example of the string arrangement and current direction of an integrated string by photoelectric conversion elements corresponding to the external profile of the integrated type solar cell according to the first embodiment.

Although each integrated type solar cell 1 has been described based on an example of integrated type solar cell 1 formed on one glass substrate having a predetermined external profile, the integrated solar cell may be based on a combination of a plurality of such integrated type solar cells 1. One such example is shown in FIG. 21. Integrated type solar cell 1 of FIG. 21 corresponds to a combination of an integrated type solar cell based on the integrated type solar cell shown in FIG. 5 (first integrated type solar cell 1a), and an integrated type solar cell based on the integrated type solar cell shown in FIG. 4 (second integrated type solar cell 1b). The integrated type solar cell 1 of FIG. 21 is formed of eight integrated strings 21. In association with the eight integrated strings 21, strings 21a-21h corresponding to one of the two strings connected in series are provided in first integrated type solar cell 1a, whereas strings 21i, 21j, 21k, 21m, 21n, 21p, 21q and 21r corresponding to the other of the two strings connected in series are provided in second integrated type solar cell 1b.

In first integrated type solar cell a, photoelectric conversion elements 20 are arranged such that the direction (arrow) of current flowing through each of strings 21a-21h is the same. In second integrated type solar cell 1b, photoelectric conversion elements 20 are arranged such that the direction (arrow) of current flowing through each of strings 21i, 21j, 21k, 21m, 21n, 21p, 21q and 21r is the same. Minus electrode 24 is formed at the outer edge side corresponding to one of the two line segments constituting the right angle in first integrated type solar cell 1a taking the shape of a trapezoid or schematic right triangle. Plus electrode 22 is formed at the outer edge side corresponding to the hypotenuse of second integrated type solar cell 1b taking the shape of a trapezoid or a right triangle.

Furthermore, the ends of respective strings 21a-21h located at the outer edge side corresponding to the other of the two line segments constituting the right angle in first integrated type solar cell 1a are electrically connected to the ends of respective strings 21i, 21j, 21k, 21m, 21n, 21p, 21q and 21r located at the outer edge side corresponding to one of the two line segments constituting the right angle in second integrated type solar cell 1b by external interconnections 25a-25h. By arranging first and second integrated type solar cells 1a and 1b in parallel, the external profile of integrated type solar cell 1 can take a schematic isosceles triangle.

Figure 22:
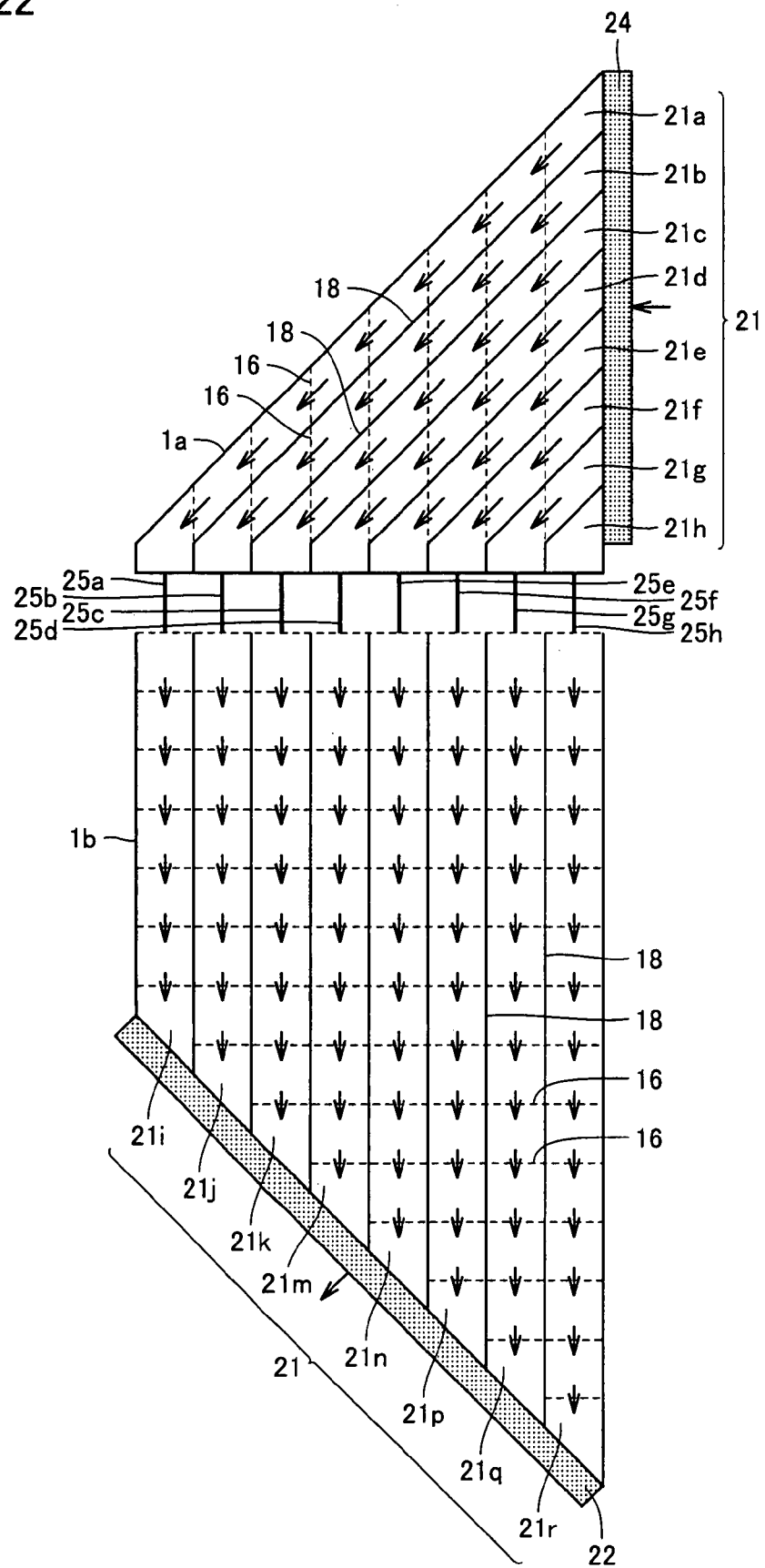
FIG. 22 is a plan view of a ninth example of the string arrangement and current direction of an integrated string by photoelectric conversion elements corresponding to the external profile of the integrated type solar cell according to the first embodiment.

Another example of an integrated type solar cell based on a combination of a plurality of integrated type solar cells having a predetermined external profile is shown in FIG. 22. The integrated type solar cell of FIG. 22 corresponds to a combination of an integrated type solar cell (first integrated type solar cell 1a) based on the integrated type solar cell shown in FIG. 5 and an integrated type solar cell (second integrated type solar cell 1b) based on the integrated type solar cell of FIG. 7. Integrated type solar cell 1 of FIG. 22 is formed of eight integrated strings 21. In association with the eight integrated strings 21, strings 21a-21h corresponding to one of the two strings connected in series are provided in first integrated type solar cell 1a, whereas strings 21i, 21j, 21k, 21m, 21n, 21p, 21q and 21r corresponding to the other of the two strings connected in series are provided in second integrated type solar cell 1b.

In first integrated type solar cell 1a, photoelectric conversion elements 20 are arranged such that the direction (arrow) of current flowing through each of strings 21a-21h is all the same. In second integrated type solar cell 1b, photoelectric conversion elements 20 are arranged such that the direction (arrow) of current flowing through each of strings 21i, 21j, 21k, 21m, 21n, 21p, 21q and 21r is all the same. Minus electrode 24 is formed at the outer edge side corresponding to one of the two line segments constituting the right angle in first integrated type solar cell a taking the shape of a trapezoid or a schematic right triangle. Plus electrode 22 is formed at the outer edge side corresponding to the oblique line segment of second integrated type solar cell 1b taking the shape of a trapezoid.

The ends of respective strings 21a-21h located at the outer edge side corresponding to the other of the two line segments constituting the right angle in first integrated type solar cell 1a are electrically connected to the ends of respective strings 21i, 21j, 21k, 21m, 21n, 21p, 21q and 21r located at the line segment side opposite to the oblique line segment of second integrated type solar cell 1b taking the shape of a trapezoid by external interconnections 25a-25h. By arranging first and second integrated type solar cells 1a and 1b in parallel, integrated type solar cell 1 can take an external profile of a schematic isosceles trapezoid. In the case where integrated type solar cell 1 as shown in FIGS. 21 and 22 is employed, an interconnection employing a flexible substrate, for example, can be applied to external interconnections 25a-25h.

By appropriately combining and arranging in parallel integrated type solar cells having an external profile of a triangle, rectangle, or trapezoid for the integrated type solar cell set forth above, an integrated type solar cell corresponding to the planar shape of the roof can be developed.

Second Embodiment

Figure 23:
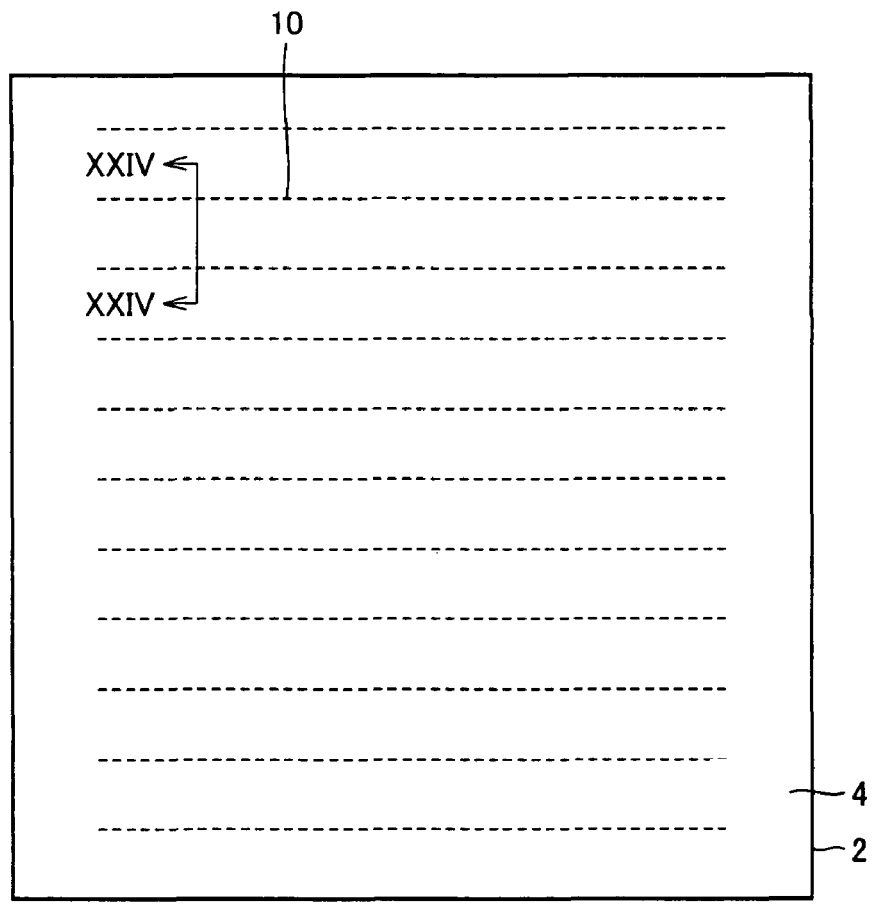
FIG. 23 is a plan view of a step in a fabrication method of an integrated type solar cell according to a second embodiment of the present invention.
Figure 24:
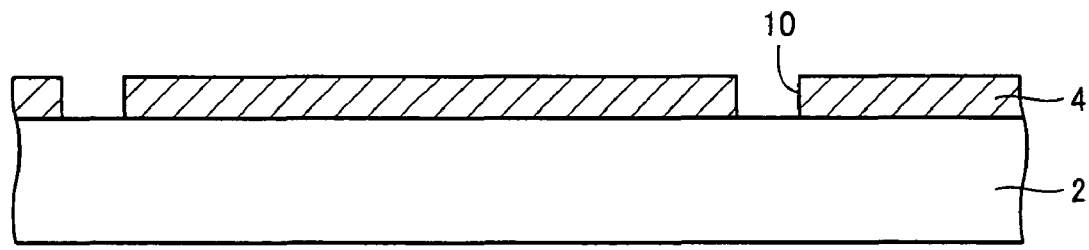
FIG. 24 is a sectional view taken along line XXIV-XXIV of FIG. 23 according to the second embodiment.

As an example of a fabrication method of an integrated type solar cell set forth above, the fabrication method of integrated type solar cell 1 shown in FIG. 2 or 16 will be described hereinafter. First, referring to FIGS. 23 and 24, a glass substrate 2 of a predetermined external profile having a transparent conductive film 4 formed on the main surface is subjected to laser scribing to have transparent conductive film 4 of a predetermined pattern removed. Accordingly, a first scribe region 10 exposing the surface of glass substrate 2 is formed. The thickness of glass substrate 2 is set to approximately 0.1 mm to 10 mm, for example. For transparent conductive film 4, an ITO (Indium Tin Oxide) film, an $SnO_2$ film, a ZnO film, or the like having a thickness of approximately 0.1 μm to 10 μm is employed.

Then, p type amorphous silicon, i type amorphous silicon, and n type amorphous silicon are sequentially formed on transparent conductive film 4 by, for example, plasma CVD (Chemical Vapor Deposition). Accordingly, a photoelectric conversion layer 6 (refer to FIG. 25) formed of p type amorphous silicon, i type amorphous silicon, and n type amorphous silicon is obtained.

Figure 25:
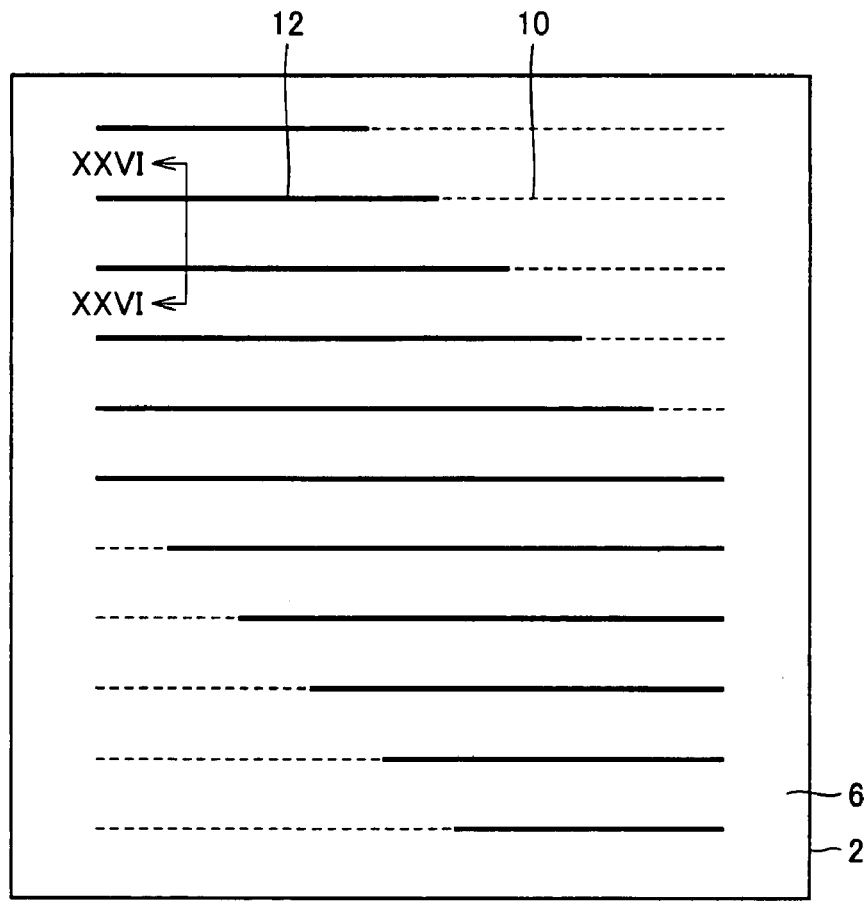
FIG. 25 is a plan view of a step subsequent to the step of FIG. 23 according to the second embodiment.
Figure 26:
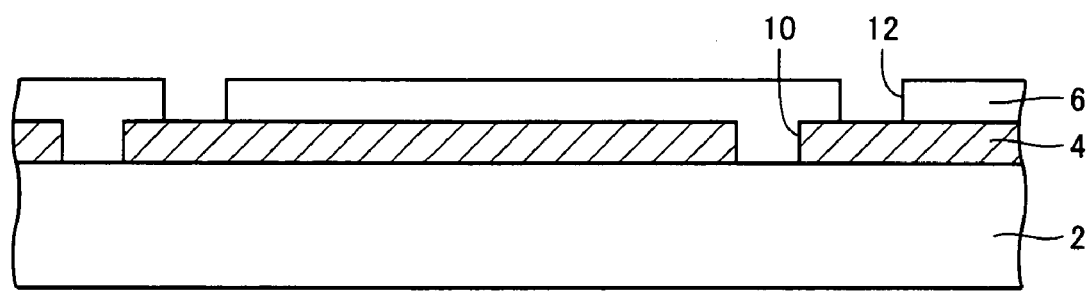
FIG. 26 is a sectional view taken along line XXVI-XXVI of FIG. 25 according to the second embodiment.
Figure 27:
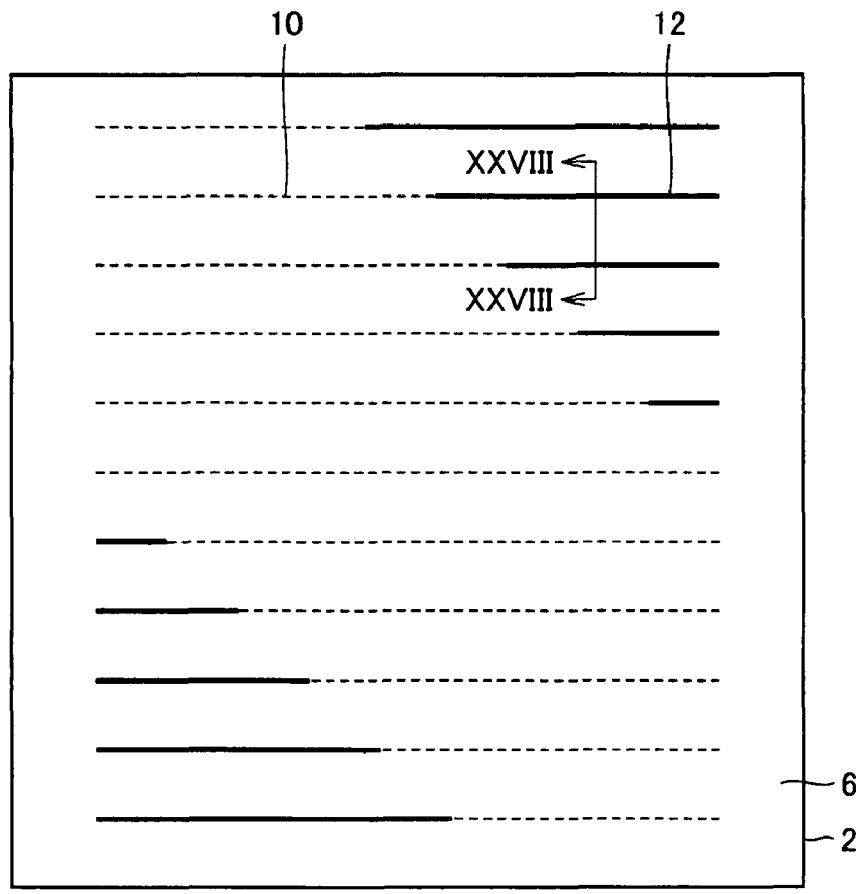
FIG. 27 is a plan view of a step subsequent to the step of FIG. 25 according to the second embodiment.
Figure 28:
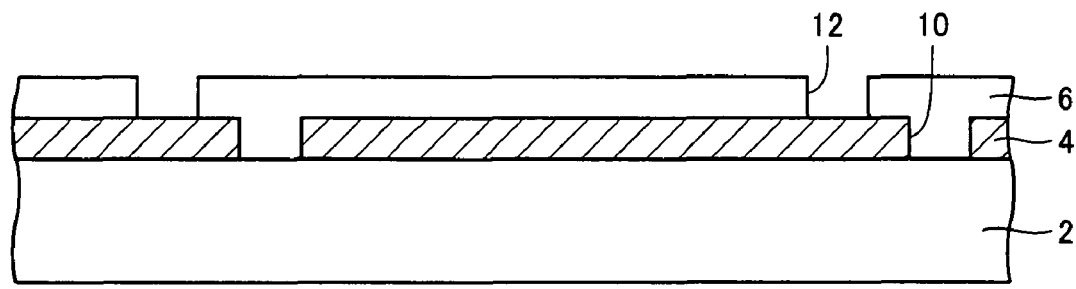
FIG. 28 is a sectional view taken along line XXVIII-XXVIII of FIG. 27 according to the second embodiment.

Referring to FIGS. 25 and 26, a specific region of photoelectric conversion layer 6 with respect to first scribe region 10 is subjected to laser scribing, whereby photoelectric conversion layer 6 of a predetermined pattern is removed. Accordingly, a second scribe region 12 exposing the surface of transparent conductive film 4 is obtained. In a similar manner, another specific region of photoelectric conversion layer 6 with respect to first scribe region 10 is subjected to laser scribing, whereby photoelectric conversion layer 6 of a predetermined pattern is removed. Accordingly, an additional second scribe region 12 exposing the surface of transparent conductive film 4 is obtained.

Then, a conductive film (not shown) that will function as a back electrode is formed on photoelectric conversion layer 4 by sputtering, for example. For this conductive film, a silver film (Ag), an aluminum (Al) film, or a layered film thereof having a film thickness of approximately 10 nm to 1 mm is employed. Furthermore, titanium (Ti), cobalt (Co), nickel (Ni), gold (Au), carbon (C), or the like can be employed.

Figure 29:
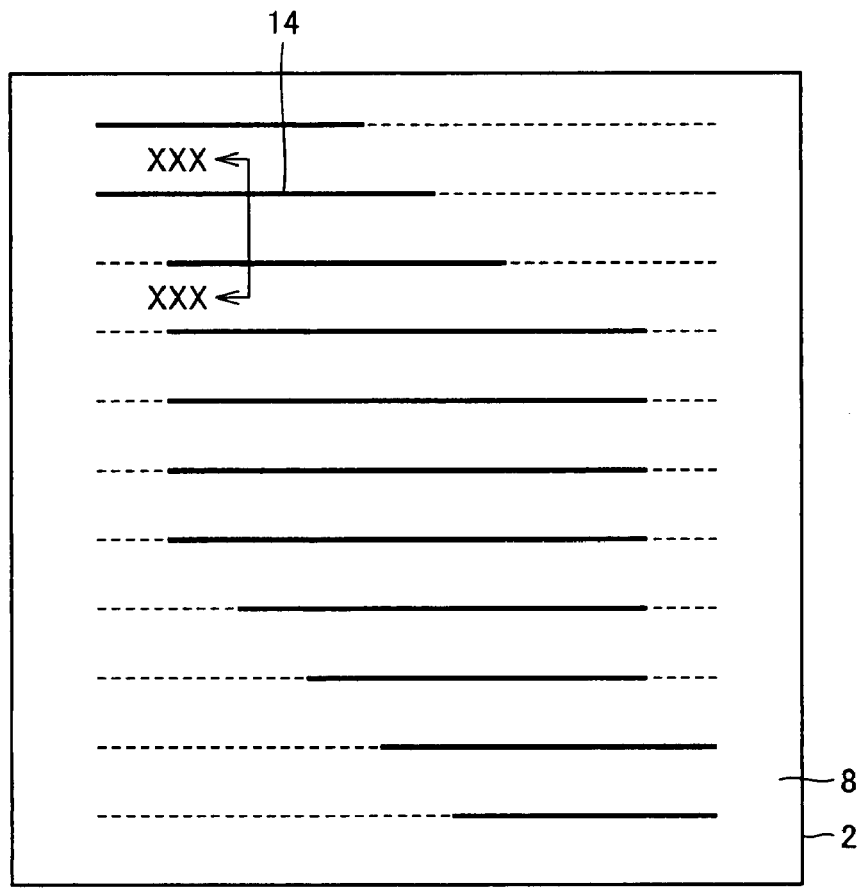
FIG. 29 is a plan view of a step subsequent to the step of FIG. 27 according to the second embodiment.
Figure 30:
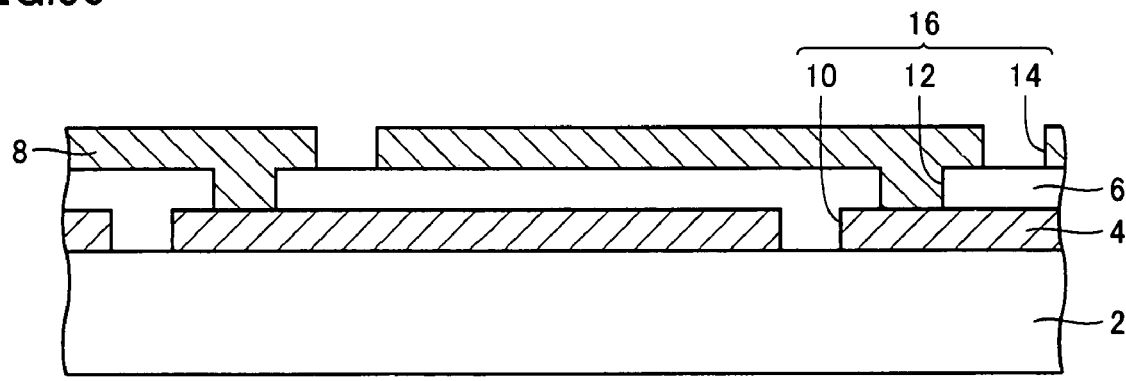
FIG. 30 is a sectional view taken along line XXX-XXX of FIG. 29 according to the second embodiment.
Figure 31:
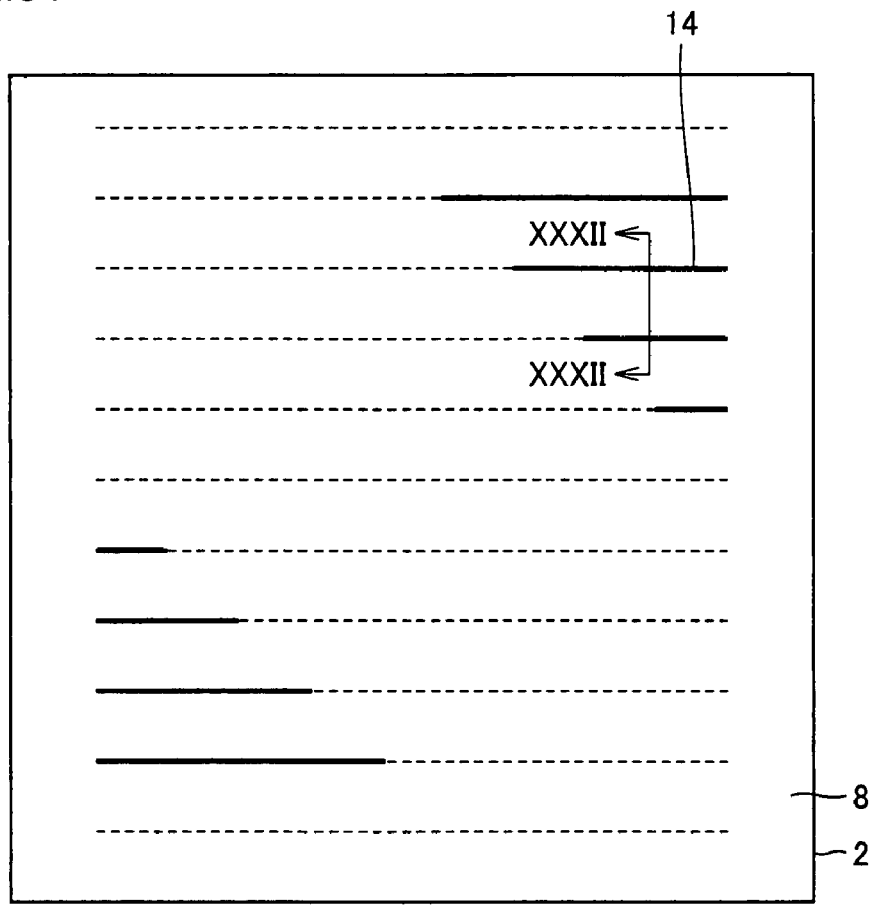
FIG. 31 is a plan view of a step subsequent to the step of FIG. 29 according to the second embodiment.
Figure 32:
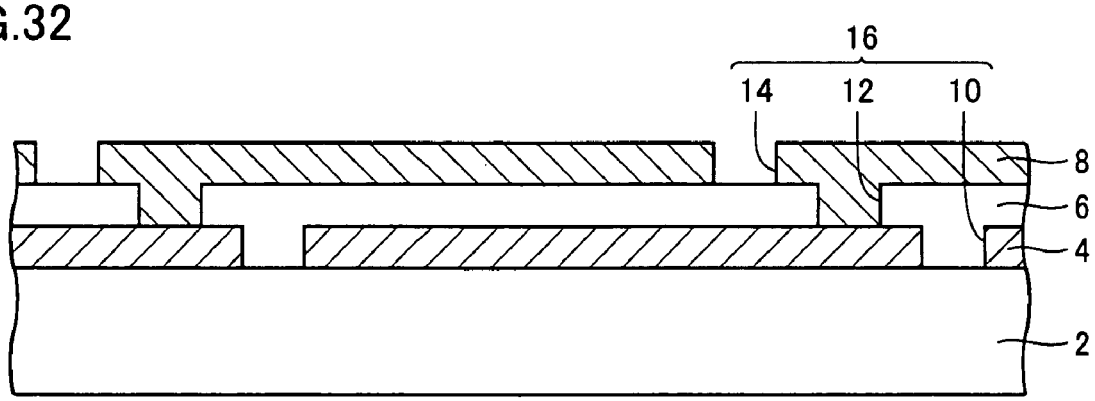
FIG. 32 is a sectional view taken along line XXXII-XXXII of FIG. 31 according to the second embodiment.

Referring to FIGS. 29 and 30, a specific region of conductive film 8 with respect to first scribe region 10 and second scribe region 12 is subjected to laser scribing, whereby conductive film 8 of a predetermined pattern is removed. Accordingly, a third scribe region 14 exposing the surface of photoelectric conversion layer 6 is obtained. In a similar manner, as shown in FIGS. 31 and 32, an additional specific region of conductive film 8 with respect to first scribe region 10 and second scribe region 12 is subjected to laser scribing, whereby conductive film 8 of a predetermined pattern is removed. Accordingly, an additional third scribe region 14 exposing the surface of photoelectric conversion layer 6 is obtained. Thus, connection line region 16 formed of first scribe region 10, second scribe region 12, and third scribe region 14 is provided.

Figure 33:
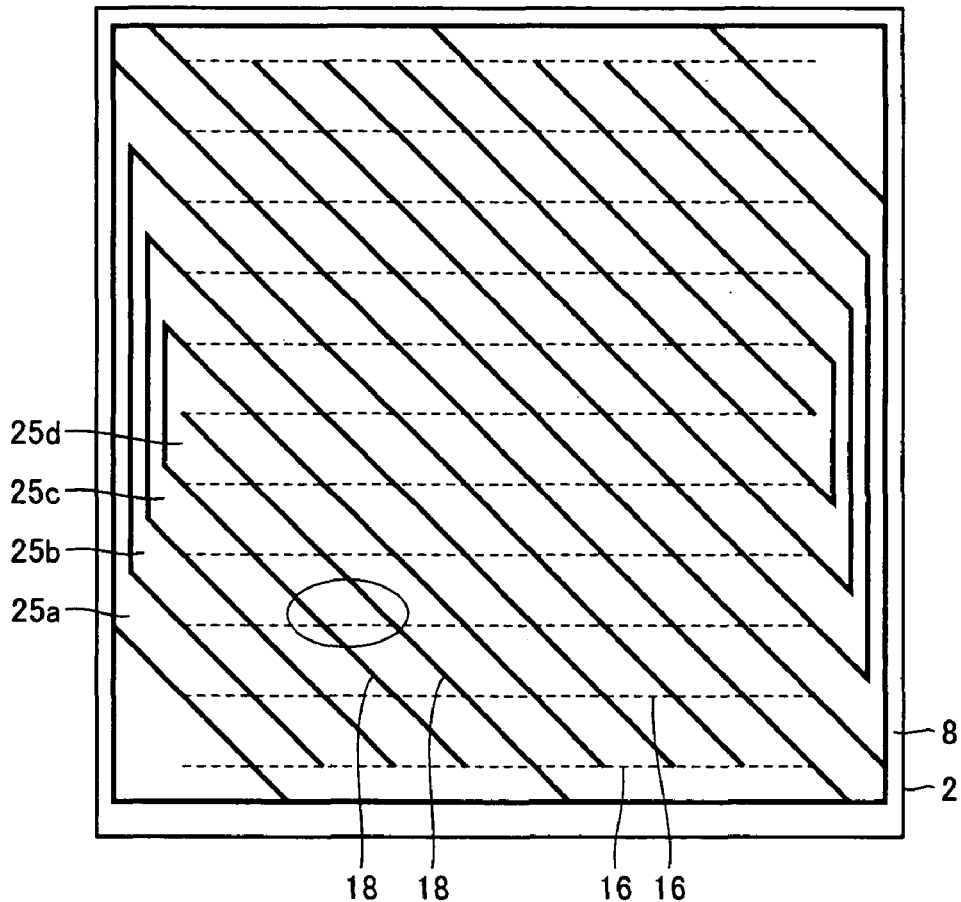
FIG. 33 is a plan view of a step subsequent to the step of FIG. 31 according to the second embodiment.
Figure 34:
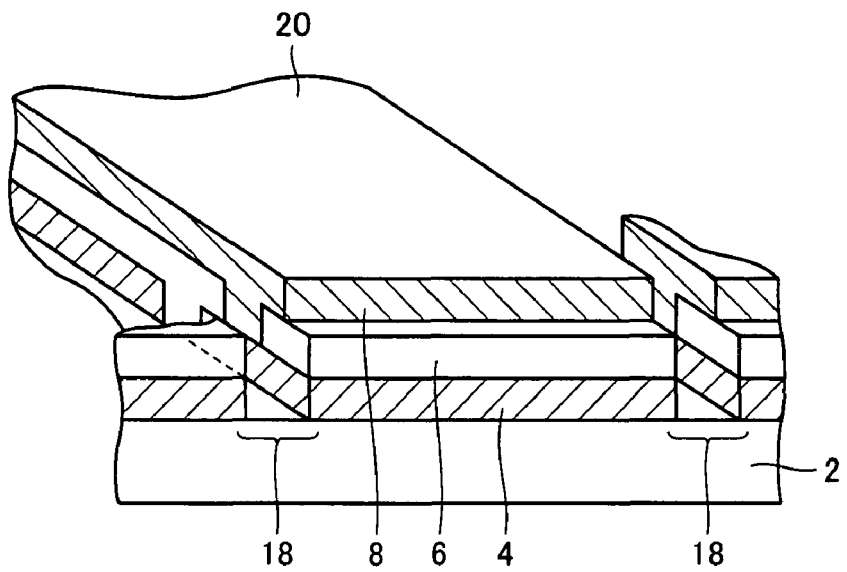
FIG. 34 is a partial cross sectional perspective view of a configuration of the region in the circle of FIG. 33 according to the second embodiment.

Referring to FIGS. 33 and 34, a predetermined region of conductive film 8, photoelectric conversion layer 6, and transparent conductive film 4 are subjected to laser scribing, whereby conductive film 8, photoelectric conversion layer 6, and transparent conductive film 4 of a predetermined pattern are removed. Accordingly, isolation line region 18 exposing the surface of glass substrate 2 is obtained. At this stage, laser that can effect removal from conductive film 8 qualified as a back electrode as far as to transparent conductive film 4 is employed. Isolation line region 18 is formed by applying a laser scribing process on conductive film 8 or the like by changing the direction several times with the usage of a mask. Accordingly, a string is formed having photoelectric conversion elements 20 electrically connected in series by connection line region 16 while adjacent strings are electrically insulated from each other.

Figure 16:
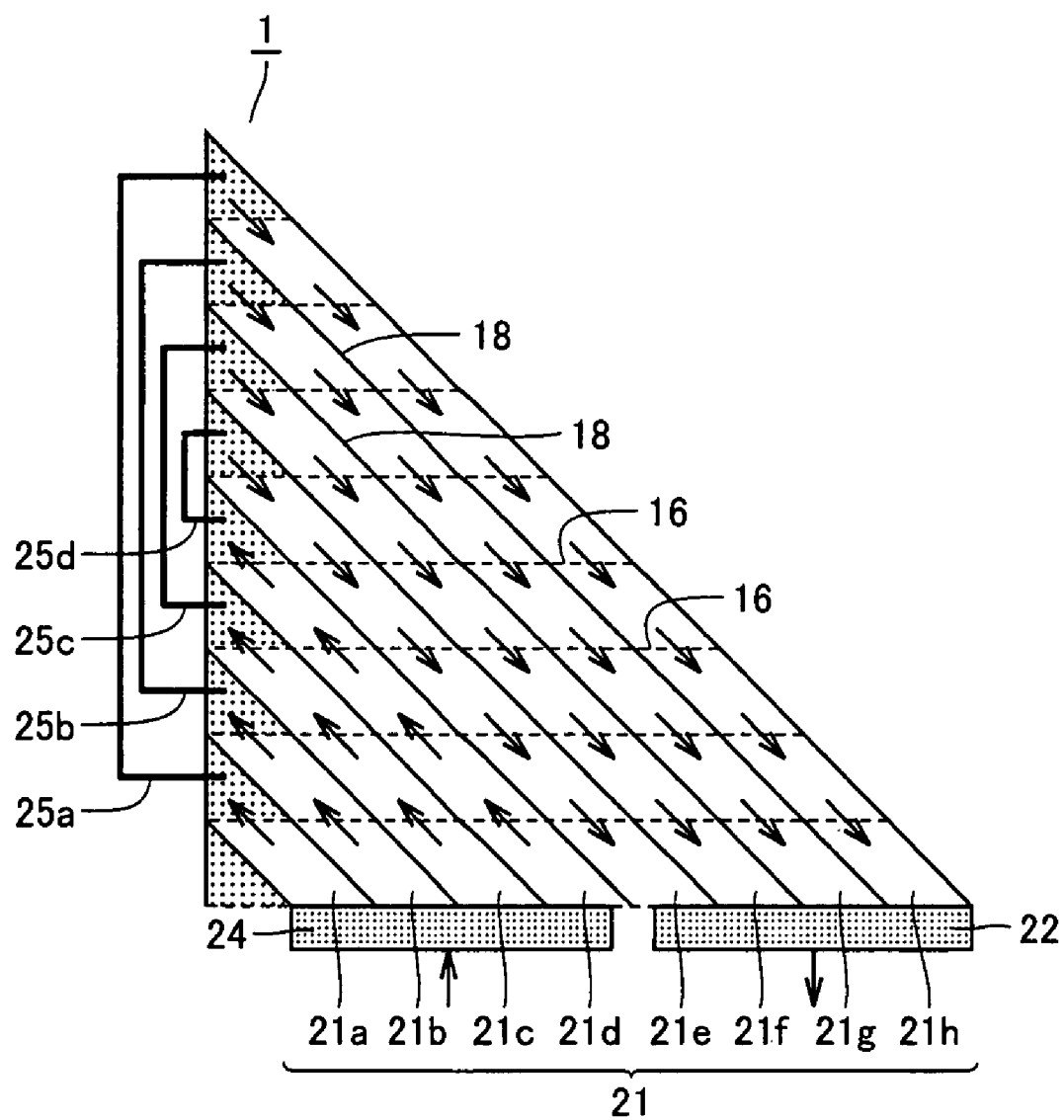
FIG. 16 is a plan view of a third example of the string arrangement and current direction of an integrated string by photoelectric conversion elements corresponding to the external profile of the integrated type solar cell according to the first embodiment.

At this stage, external interconnections 25a-25d for electrical connection between two strings in integrated string 21 shown in FIG. 16 are formed at the same time. Specifically, as shown in FIGS. 16 and 33, string 21a and string 21h are electrically connected by external interconnection 25a formed at the outermost side of glass substrate 2. String 21b and string 21g are electrically connected by external interconnection 25b formed at the inner side than external interconnection 25a. String 21c and string 21f are connected by external interconnection 25c formed at the inner side than external interconnection 25b. Furthermore, string 21d and string 21e are connected by external interconnection 25d formed at the inner side than external interconnection 25c.

Figure 35:
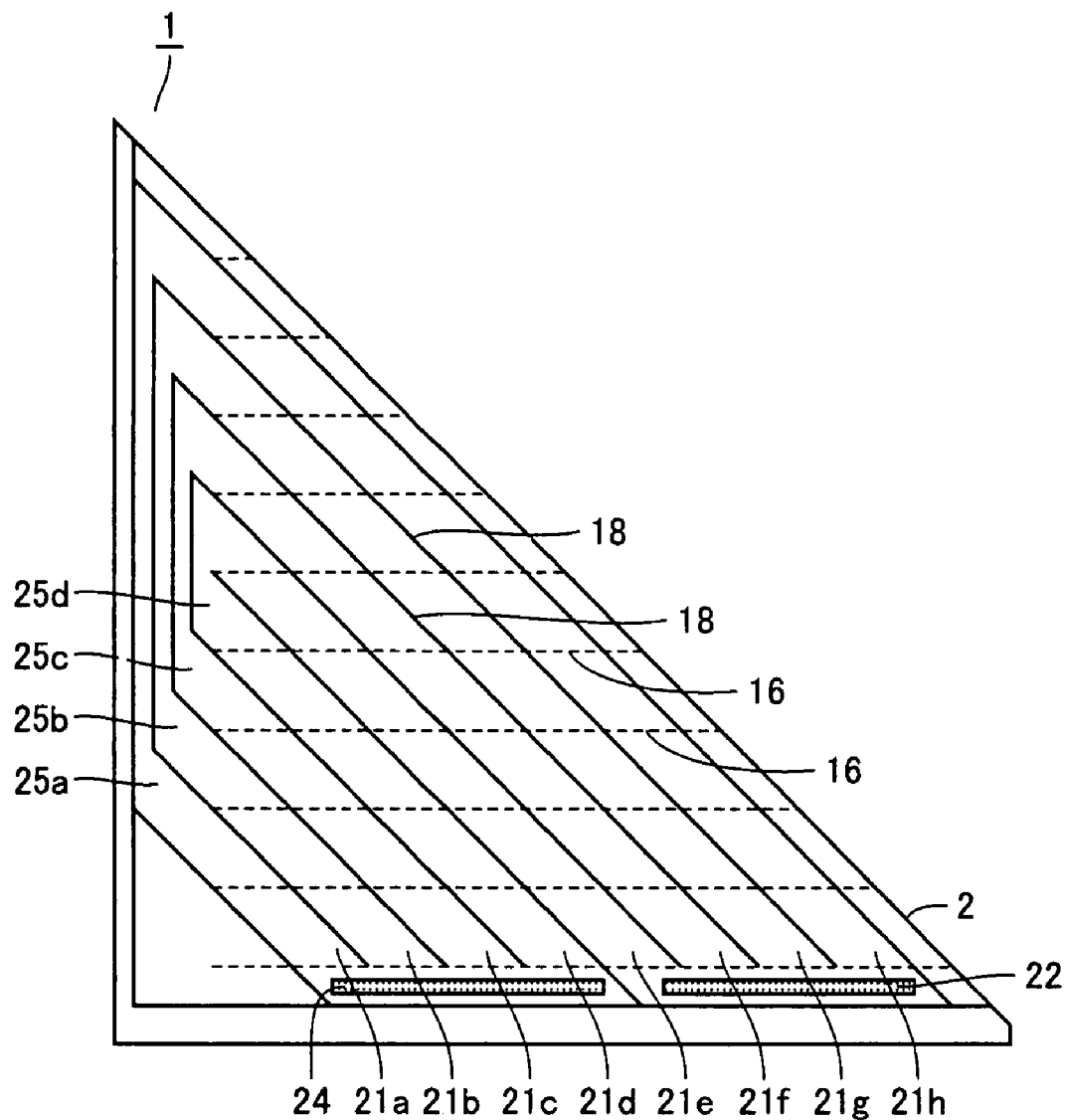
FIG. 35 is a plan view of a step subsequent to the step of FIG. 33 according to the second embodiment.

Referring to FIG. 35, glass substrate 2 is divided into two in the diagonal direction to obtain integrated type solar cell 1 having an external profile of a schematic triangle. Then, plus electrode 22 is formed at the outer edge side corresponding to the line segment where external interconnections 25a-25d are not formed of the two line segments constituting the right angle of the right triangle in strings 21e-21h. Minus electrode 24 is formed at the outer edge side corresponding to that line segment in strings 2a-2d. Thus, integrated type solar cell 1 is completed, including four integrated strings respectively having two strings electrically connected, as set forth above.

An integrated type solar cell other than the integrated type solar cell shown in FIG. 2 or 16 can be readily fabricated by forming connection line regions and isolation line regions of a predetermined pattern based on application of the fabrication method set forth above.

In accordance with the integrated type solar cell and fabrication method thereof set forth above, electrical connection of a plurality of photoelectric conversion elements can be effected readily on a glass substrate by connection line regions and isolation line regions formed on the glass substrate, without using an additional member. Further, by delimiting respective photoelectric conversion elements through isolation line regions formed extending in one direction and connection line regions extending in another direction crossing the one direction, the shape and area of respective photoelectric conversion elements can be made identical. Variation in the photoelectric conversion property can be eliminated. Output can be effected efficiently.

It should be understood that the embodiments disclosed herein are non-restrictive in every respect. The scope of the present embodiments are defined by the terms of the claims, rather than the description above, and is intended to include any modification within the scope and meaning equivalent to the terms of the claims.

The present embodiment is effectively utilized for sunlight power generation at a general house or the like.

The invention claimed is:

1. A solar cell including a plurality of photoelectric conversion elements, comprising:
   a transparent insulation substrate having a predetermined external profile,
   a prescribed layer formed on a main surface of said transparent insulation substrate for formation of a photoelectric conversion element, and
   a plurality of photoelectric conversion elements formed by delimiting said prescribed layer with a plurality of isolation line regions spaced apart from each other, extending in one direction, and exposing a surface of said transparent insulation substrate, and a plurality of connection line regions spaced apart from each other, extending in another direction crossing said one direction, wherein
   a string having said photoelectric conversion elements electrically connected in series by said connection line regions is formed at each of a plurality of regions located between said isolation line regions,
   an integrated string having one string electrically connected to a further string is formed in plurality by said string formed at each of a plurality of regions located between said isolation line regions, and
   a plurality of said integrated strings are electrically connected in parallel, wherein said transparent insulation substrate has an external profile of a triangle formed of a first outer edge, a second outer edge, and a third outer edge, each of said isolation line regions is arranged substantially parallel to said first outer edge, and each of said connection line regions is arranged substantially parallel to said second outer edge, the solar cell further comprising a plurality of additional connection line regions arranged substantially parallel to said third outer edge, and spaced apart from each other, such that each said photoelectric conversion element takes an external profile of a triangle, and wherein said isolation line region comprises a pair of regions to expose a surface of said transparent insulation substrate and having a region where said connection line region crosses said additional connection line region located between one and the other of said pair of regions.

2. The solar cell according to claim 1, wherein each of said plurality of integrated strings has a sum of the number of said photoelectric conversion elements in said one string and the number of said photoelectric conversion elements in said further string set identical with each other.

3. The solar cell according to claim 1, comprising an additional transparent insulation substrate having an external profile of a quadrilateral, and a plurality of additional photoelectric conversion elements formed at said additional transparent insulation substrate, said solar cell having an external profile of a trapezoid by electrically connecting said plurality of photoelectric conversion elements formed at said transparent insulation substrate with said additional photoelectric conversion elements formed at said additional transparent insulation substrate, and arranging said transparent insulation substrate and said additional transparent insulation substrate in parallel.

4. The solar cell according to claim 1, wherein said one string and said further string is electrically connected on said transparent insulation substrate by patterning through said isolation line region.

5. The solar cell according to claim 4, wherein respective terminals electrically connecting said one string and said further string are connected at an identical outer edge side of said transparent insulation substrate by arranging said one string and said further string such that a direction of current flowing through said one string is opposite to the direction of current flowing through said further string at each of said plurality of integrated strings.

* * * * *